(12) United States Patent
Yamano et al.

(10) Patent No.: US 10,299,371 B2
(45) Date of Patent: May 21, 2019

(54) ELECTRONIC DEVICE AND DISPLAY DEVICE

(71) Applicant: Japan Display Inc., Tokyo (JP)

(72) Inventors: Atsuhiro Yamano, Tokyo (JP); Shinichi Nukumizu, Tokyo (JP)

(73) Assignee: Japan Display Inc., Tokyo (JP)

( * ) Notice: Subject to any disclaimer, the term of this patent is extended or adjusted under 35 U.S.C. 154(b) by 28 days.

(21) Appl. No.: 15/798,578

(22) Filed: Oct. 31, 2017

(65) Prior Publication Data
US 2018/0132346 A1    May 10, 2018

(30) Foreign Application Priority Data

Nov. 7, 2016  (JP) ................................. 2016-217134

(51) Int. Cl.
| H05K 1/02 | (2006.01) |
| H05K 1/18 | (2006.01) |
| H01G 4/12 | (2006.01) |
| H01G 4/30 | (2006.01) |
| H05B 33/08 | (2006.01) |
| H05K 3/34 | (2006.01) |

(52) U.S. Cl.
CPC ............ H05K 1/0271 (2013.01); H01G 4/12 (2013.01); H01G 4/30 (2013.01); H05B 33/0821 (2013.01); H05K 1/18 (2013.01); H05K 3/3442 (2013.01); H05K 2201/10015 (2013.01); H05K 2201/10204 (2013.01); H05K 2201/10522 (2013.01); H05K 2201/2045 (2013.01)

(58) Field of Classification Search
CPC ...... H05K 1/0216; H05K 1/0271; H05K 1/18; H05K 1/181; H05K 1/82; H05K 3/30; H05K 3/3442; H05K 2201/2045; H05K 2201/10015; H05K 2201/10515; H05K 2201/10545; H01G 4/30; H01G 4/232; H01G 4/12; H01G 4/272; H01G 2/06; H01G 2/065; Y02P 70/611; Y02P 70/613
See application file for complete search history.

(56) References Cited

U.S. PATENT DOCUMENTS

| 7,283,107 | B2 * | 10/2007 | Chao | ...................... | H05B 33/08 |
| | | | | | 345/68 |
| 9,277,647 | B2 * | 3/2016 | Fujimoto | ................. | H01G 4/30 |
| 9,313,876 | B2 * | 4/2016 | Dogauchi | ............ | H05K 1/0216 |
| 9,697,953 | B2 * | 7/2017 | Park | ........................ | H01G 4/30 |

FOREIGN PATENT DOCUMENTS

| JP | 2002-232110 A | 8/2002 |
| JP | 2003-324030 A | 11/2003 |
| JP | 2013-254684 A | 12/2013 |

* cited by examiner

*Primary Examiner* — Haissa Philogene
(74) *Attorney, Agent, or Firm* — K&L Gates LLP

(57) ABSTRACT

According to one embodiment, an electronic device includes a circuit board and a circuit component on an upper surface or a lower surface of the circuit board. The circuit component includes a first ceramic capacitor and a second ceramic capacitor. Vibration characteristics of the first ceramic capacitor and a second ceramic capacitor are opposed to each other. The first ceramic capacitor is near the second ceramic capacitor to cause vibrations of the first and second ceramic capacitors to cancel each other.

14 Claims, 15 Drawing Sheets

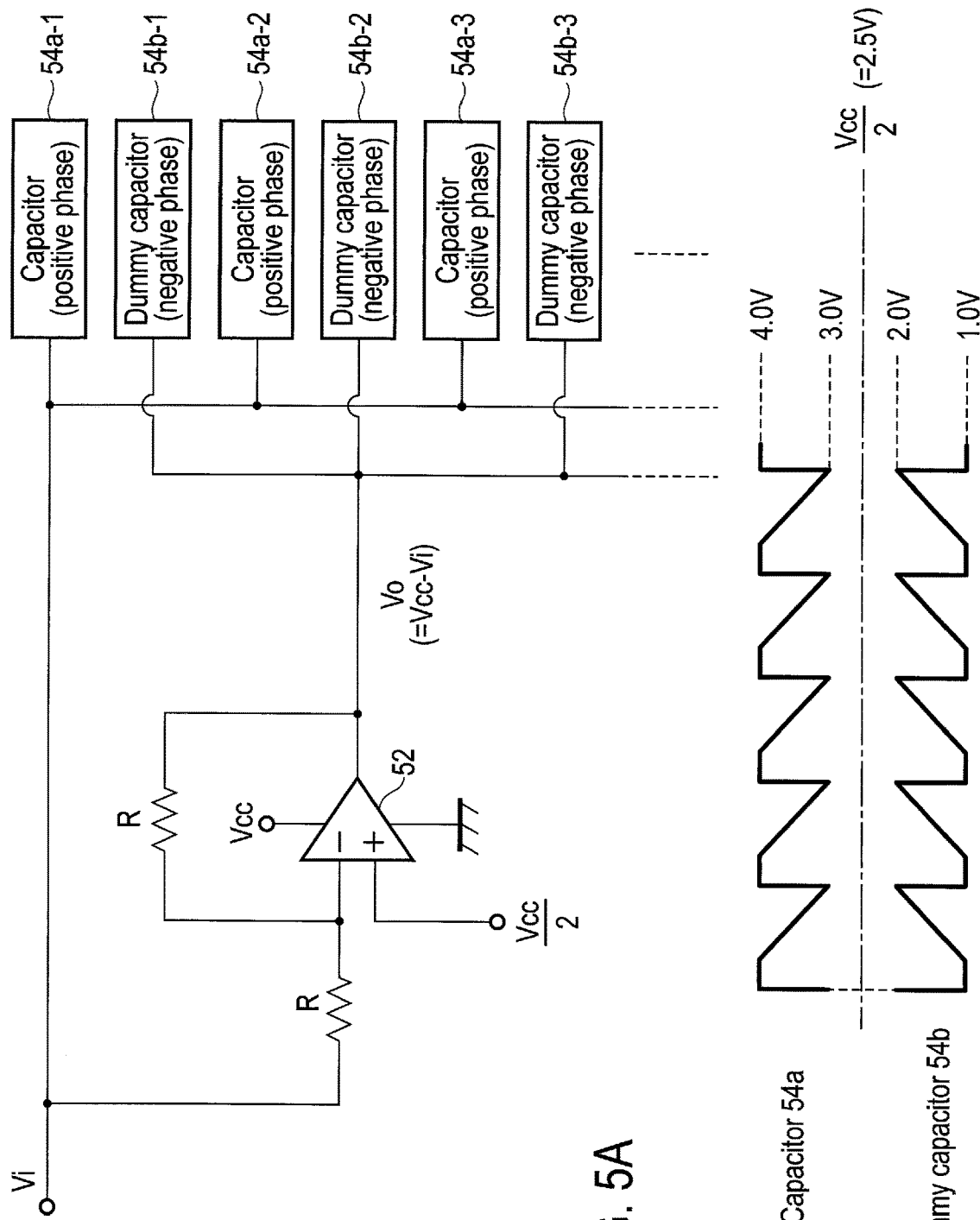

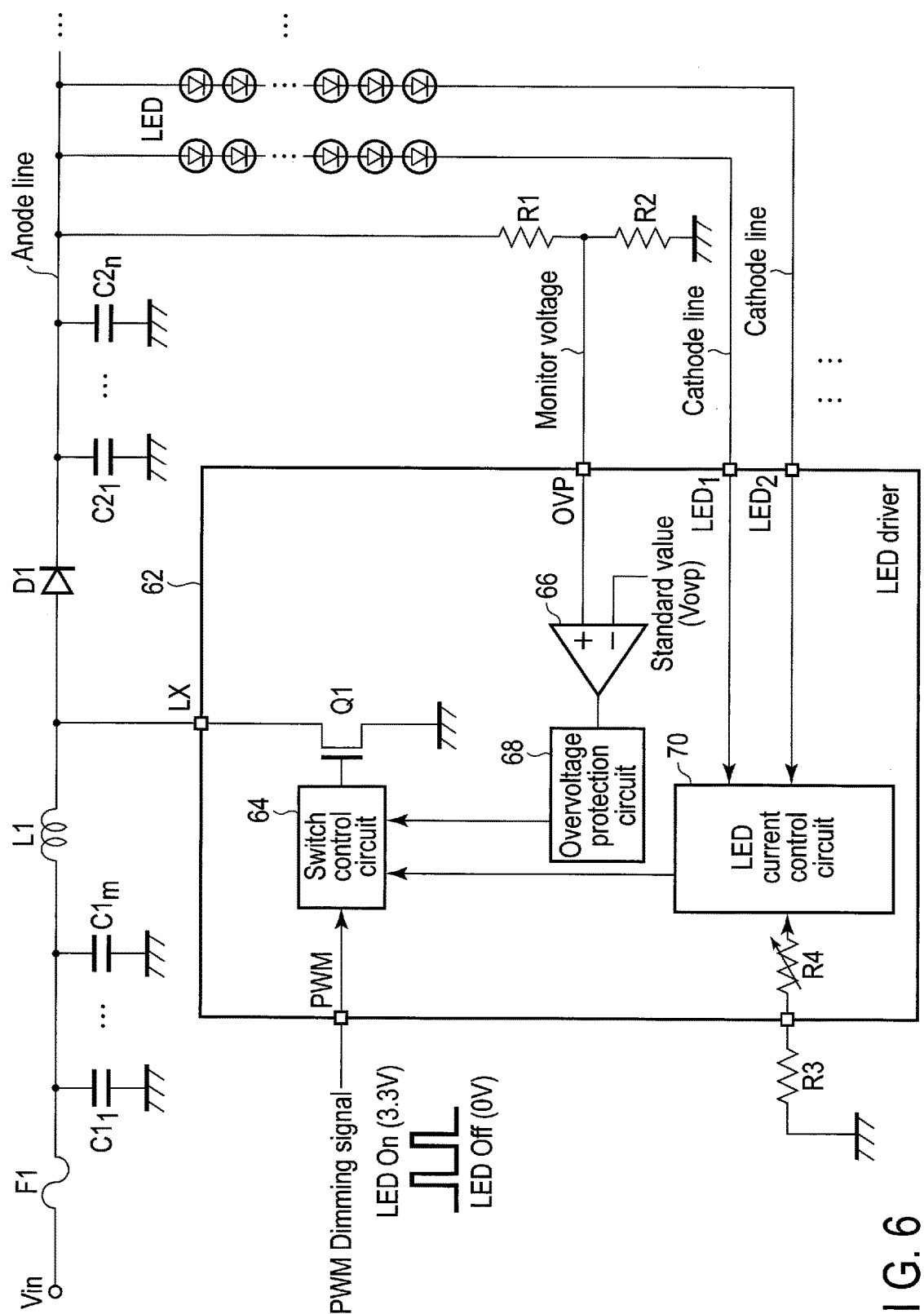
F I G. 6

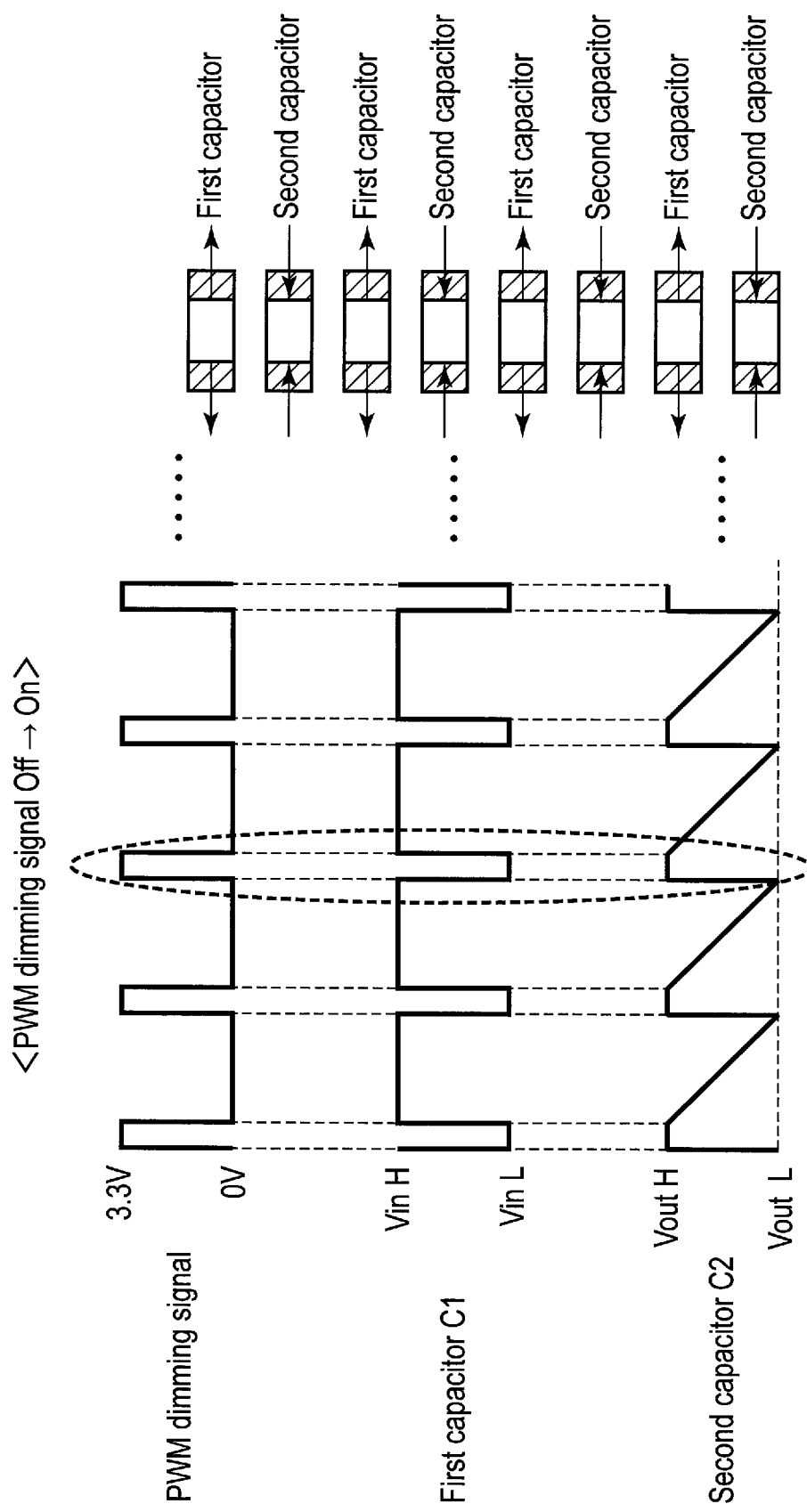
F I G. 9

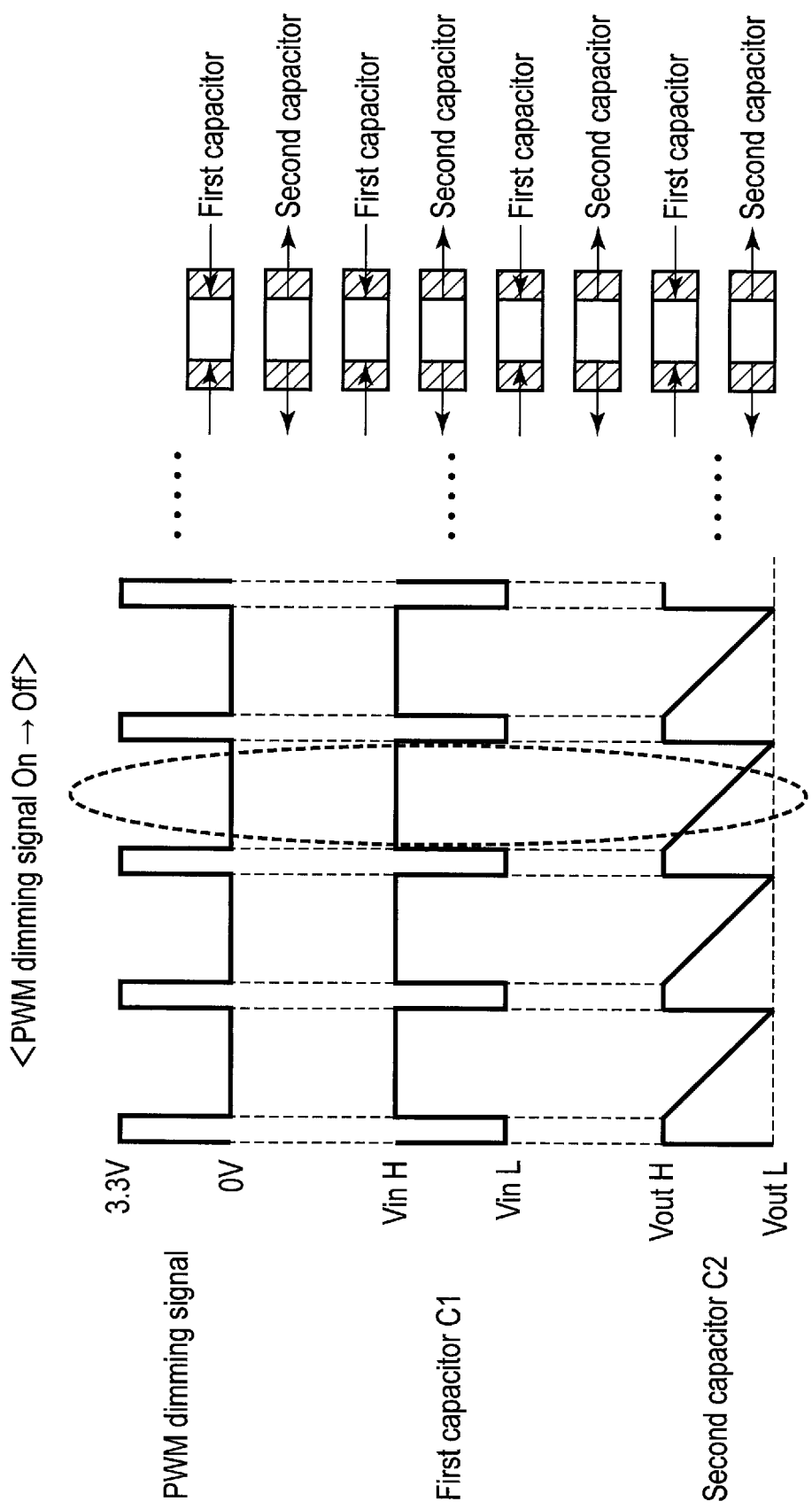
F I G. 10

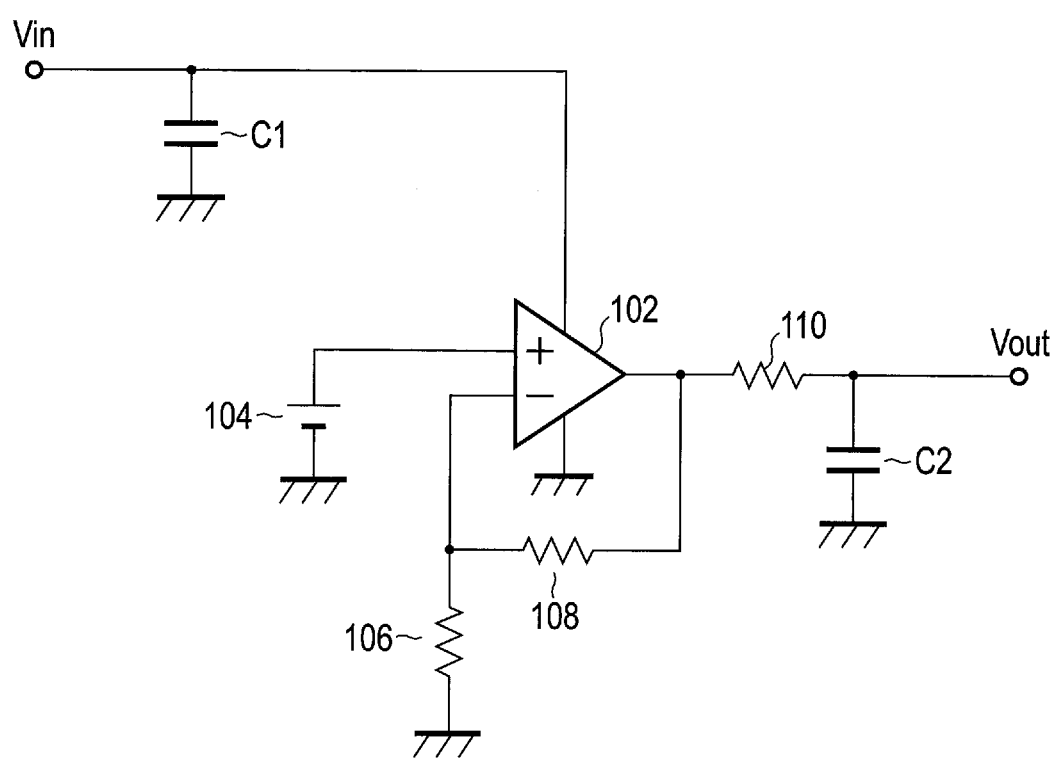
F I G. 15

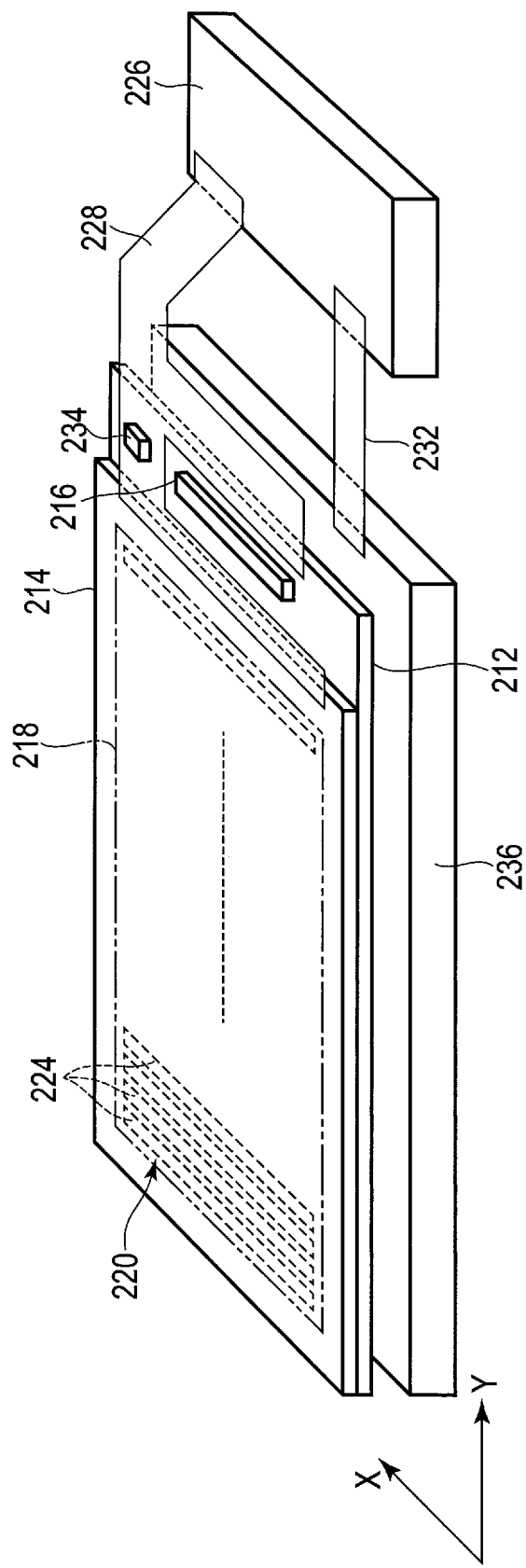
F I G. 16

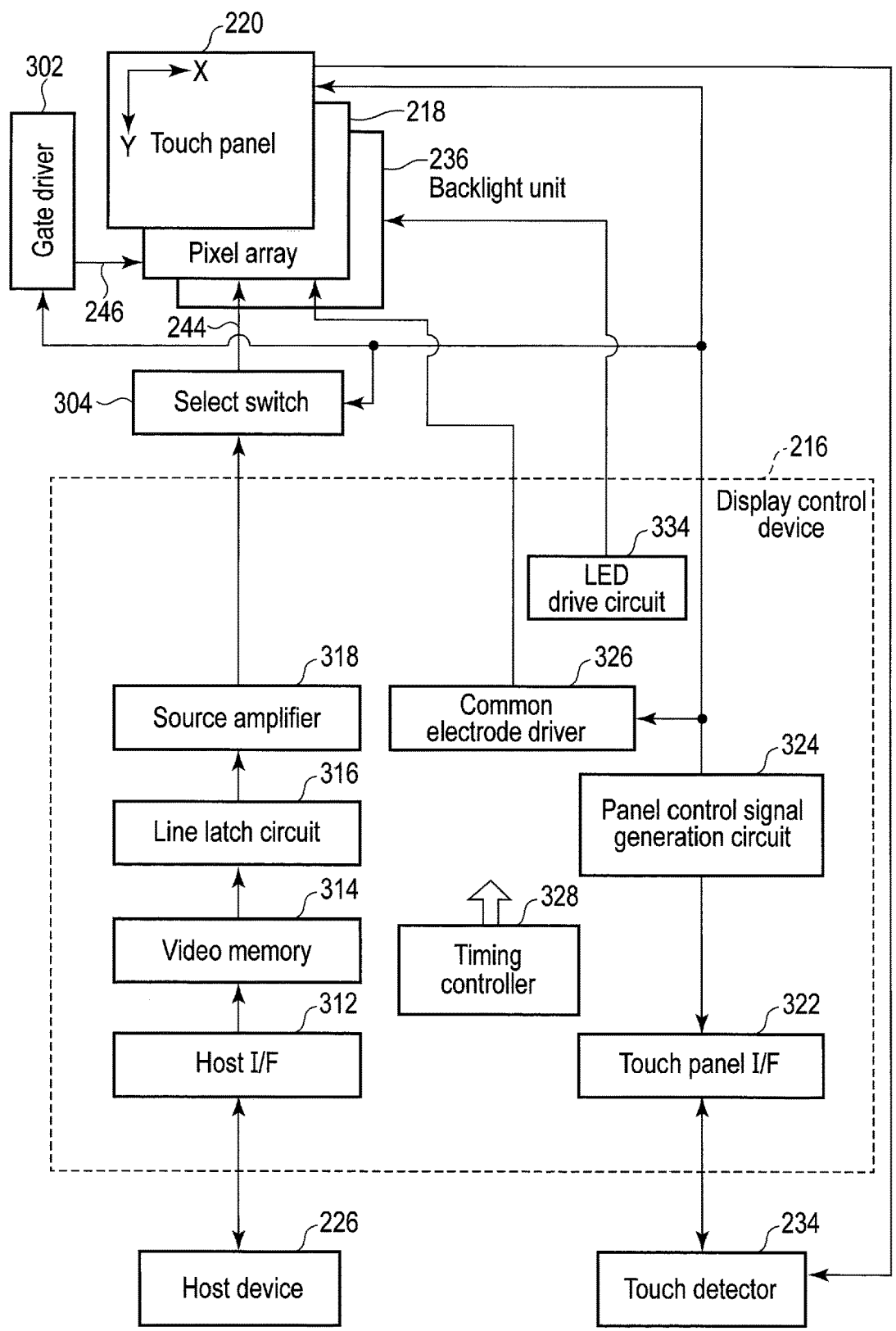
F I G. 18

ELECTRONIC DEVICE AND DISPLAY DEVICE

CROSS-REFERENCE TO RELATED APPLICATIONS

This application is based upon and claims the benefit of priority from Japanese Patent Application No. 2016-217134, filed Nov. 7, 2016, the entire contents of which are incorporated herein by reference.

FIELD

Embodiments described herein relate generally to an electronic device and a display device for preventing acoustic noise of a circuit board.

BACKGROUND

Recently, a multilayer ceramic chip capacitor (hereinafter called a ceramic capacitor) which is downsized with a large capacity and excellent in high frequency characteristics has been used in various fields. For example, a ceramic capacitor has been used as a drive circuit of a light-emitting diode (LED).

SUMMARY

The present disclosure generally relates to an electronic device and a display device for preventing acoustic noise of a circuit board.

According to one embodiment, an electronic device includes a circuit board and a circuit component on an upper surface or a lower surface of the circuit board. The circuit component includes a first ceramic capacitor and a second ceramic capacitor. Vibration characteristics of the first ceramic capacitor and a second ceramic capacitor are opposed to each other. The first ceramic capacitor is near the second ceramic capacitor to cause vibrations of the first and second ceramic capacitors to cancel each other.

Additional features and advantages are described herein, and will be apparent from the following Detailed Description and the figures.

BRIEF DESCRIPTION OF THE DRAWINGS

FIG. 5A is a diagram illustrating an example of an inverting circuit electrically connected to an input side of the negative phase capacitor.

FIG. 5B is a diagram illustrating waveforms of the positive phase capacitor and the negative phase capacitor.

FIG. 6 is a diagram illustrating an example of an LED drive circuit according to the first embodiment.

FIG. 9 is a diagram illustrating an example of voltage variation in the first capacitor and the second capacitor in a case where the PWM dimming shown in FIG. 6 is changed from "off" to "on".

FIG. 10 is a diagram illustrating an example of voltage variation in the first capacitor and the second capacitor in a case where the PWM dimming shown in FIG. 6 is changed from "on" to "off".

FIG. 15 is a diagram illustrating an example of a three-terminal regulator according to a fourth embodiment.

FIG. 16 is a perspective view illustrating an example of a schematic structure of a display device according to a fifth embodiment.

FIG. 18 is a block diagram illustrating a display device according to the fifth embodiment.

DETAILED DESCRIPTION

Figure 1A:
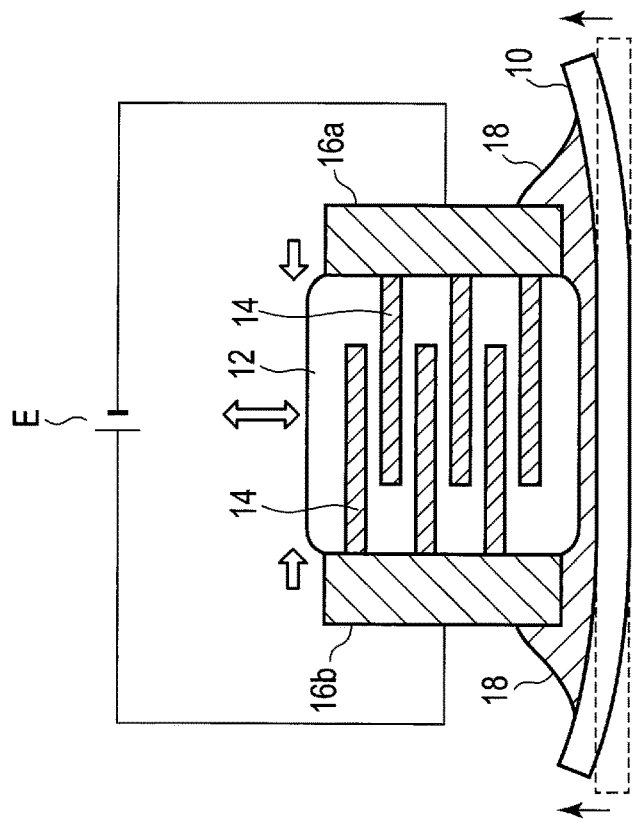
FIG. 1A is a diagram illustrating an example of a sectional structure of a ceramic capacitor.

Various embodiments will be described hereinafter with reference to the accompanying drawings.

The disclosure is merely an example and is not limited by contents described in the embodiments described below. Modification which is easily conceivable by a person of ordinary skill in the art comes within the scope of the disclosure. In order to make the description clearer, the sizes, shapes and the like of the respective parts may be changed and illustrated schematically in the drawings as compared with those in an accurate representation. Constituent elements corresponding to each other in a plurality of drawings are denoted by like reference numerals and their detailed descriptions may be omitted unless necessary.

[Mechanism of Acoustic Noise]

There is an electronic device including a ceramic capacitor. When a voltage is varied in a ceramic capacitor, a dielectric material is moved due to an electrostrictive phenomenon and the ceramic capacitor is vibrated. If this vibration propagates to a circuit board, for example, a circuit board on which the ceramic capacitor is mounted, the circuit board often resonates and vibrates. If a frequency of the vibration is low, acoustic noise occurs from the circuit board in accordance with the vibration.

In an LED drive circuit which executes PWM dimming control to adjust the brightness of LED, for example, a ceramic capacitor is used as a smoothing capacitor or the like of the LED drive circuit. For example, the PWM dimming frequency is set as a low frequency in a range of 200 Hz to 1 kHz such that flicker is not felt for a human eye and the LED can be turned on or off even when a duty ratio (often called an on/off ratio or a dimming rate) of a dimming signal is approximately below 1%.

When the ceramic capacitor on the circuit board is vibrated at such a low frequency, the circuit board and the ceramic capacitor often resonate and acoustic noise of the board at 1 kHz to approximately 10 kHz occurs. If the frequency of the voltage variation of the ceramic capacitor is sufficiently high, the circuit board cannot follow the variation of the ceramic capacitor, the circuit board is not vibrated and no acoustic noise is generated.

Even if the board is covered with the metal casing or the like, such acoustic noise caused by the resonance of the ceramic capacitor and the circuit board causes the metal casing to resonate, unlike the acoustic noise generated from the capacitor by itself, and an effective sound prevention is not realized.

Use of a tantalum capacitor or an aluminum electrolytic capacitor can be conceived but a ceramic capacitor may be used in consideration of costs, reliability and the like.

Figure 1B:
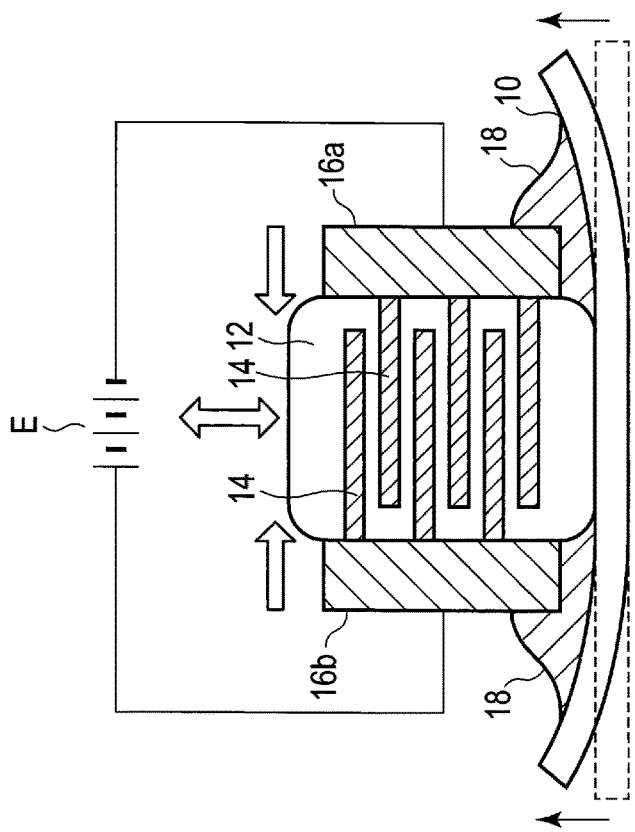
FIG. 1B is a diagram illustrating an example of a sectional structure of a ceramic capacitor.

A mechanism of occurrence of acoustic noise at a ceramic capacitor will be explained with reference to FIG. 1A and FIG. 1B. FIG. 1A and FIG. 1B show an example of a cross-sectional structure of a ceramic capacitor. For example, a pair of external electrodes 16a and 16b are arranged on, for example, right and left sides of an approximately rectangular ceramic dielectric 12. A plurality of plate-like internal electrodes 14 are layered alternately with the ceramic dielectric 12, like a sandwich, in the ceramic dielectric 12. Thus, the electrode area is increased and the miniaturization and the increase in capacity are implemented. The ceramic capacitor is mounted on an upper surface or a lower surface of a circuit board 10, for example, a printed circuit board by solder 18. Though not illustrated in the drawing, circuit components other than the ceramic capacitor are also mounted on the upper surface or the lower surface of the circuit board 10.

If a voltage E is applied between the external electrodes 16a and 16b, the electric field is applied vertically since the internal electrodes 14 are layered vertically. As shown in FIG. 1A, the ceramic dielectric 12 expands vertically and shrinks horizontally due to the electrostrictive phenomenon if the voltage E is high. As shown in FIG. 1B, the ceramic dielectric 12 shrinks vertically and expands horizontally due to the electrostrictive phenomenon if the voltage E is low. Thus, if the voltage E applied to the ceramic capacitor is varied with a frequency, the ceramic dielectric 12 shrinks and expands vertically and horizontally and acoustic noise occurs from the ceramic capacitor. If the vertical and horizontal expansion and shrinkage of the ceramic capacitor is transmitted to the circuit board 10 via the solder 18, the circuit board 10 resonates and varies and the acoustic noise also occurs from the circuit board 10.

For example, if a voltage applied to a capacitor used for a DC/DC converter or a power source circuit is varied with a high frequency higher than or equal to 10 kHz, the circuit board cannot follow the variation of the capacitor. Therefore, the circuit board is not vibrated and the acoustic noise resulting from the vibration of the circuit board is not generated. In this case, the generation of the acoustic noise is considered to result from expansion and shrinkage of the capacitor itself.

In a device having a low variation frequency of voltage, for example, an LED drive circuit which executes PWM dimming, however, the voltage is varied with a low frequency of approximately several hundreds of Hz. According to such a low frequency, the circuit board resonates and vibrates in response to the variation of the capacitor, and the acoustic noise occurs from the circuit board too. The low-frequency acoustic noise of the circuit board becomes bigger since the acoustic noise is also transmitted to a plastic member such as a frame or a metal casing which fixes the circuit board.

Figure 2:
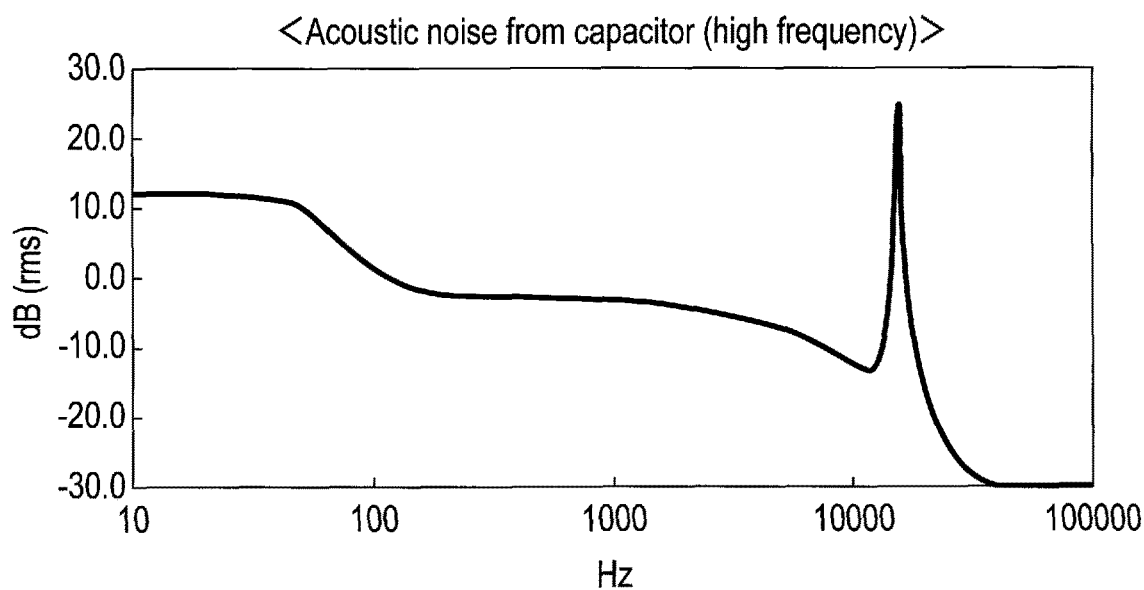
FIG. 2 is a graph illustrating an example of frequency characteristics of acoustic noise of the ceramic capacitor.
Figure 3:
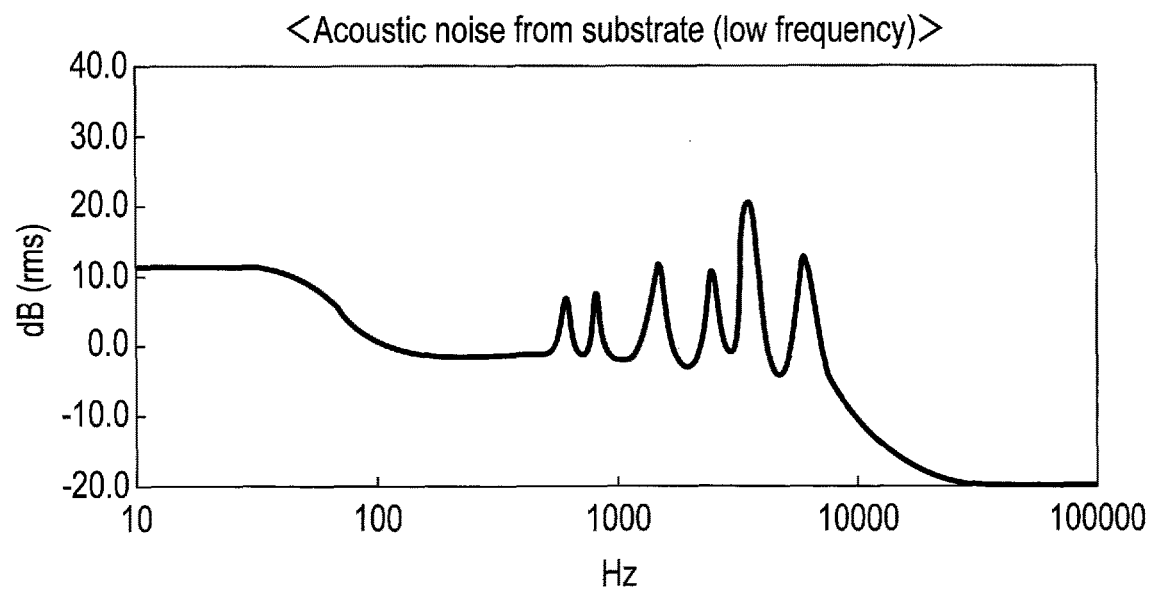
FIG. 3 is a graph illustrating an example of frequency characteristics of acoustic noise of a circuit substrate.

A measurement result of the acoustic noise (high frequency) from the capacitor in the LED drive circuit is shown in FIG. 2 while a measurement result of the acoustic noise (low frequency) from the circuit board is shown in FIG. 3. Since the acoustic noise from the capacitor is generally a single high frequency (for example, 27 dB around 15 kHz) as shown in FIG. 2, the noise can easily be blocked by the metal casing or the like. In contrast, since the acoustic noise from the circuit board is a low frequency vibration (for example, 22 dB around 3 kHz) as shown in FIG. 3, the vibration is also transmitted to an object near the circuit board and, in general, becomes a low-frequency sound formed of a plurality of frequency components. Even if the circuit board is covered with a metal casing or the like, the metal casing or the like resonates with the acoustic noise resulting from the low-frequency vibration and the noise can hardly be blocked.

The embodiment prevents the acoustic noise of the circuit board resulting from the low-frequency voltage variation of ceramic capacitor by arranging the ceramic capacitor in a specific state. The ceramic capacitor includes two types of capacitors different in phase (also called polarity). For example, two types of capacitors include a positive phase capacitor in which the voltage is increased and the dielectric size is reduced horizontally if a level of a certain rectangular wave signal is changed from a high level (or a low level) to a low level (or a high level), and a negative phase capacitor in which the voltage is reduced and the size of the dielectric is enlarged horizontally if the level of the certain rectangular wave signal is changed from the high level (or the low level) to the low level (or the high level). Since the vibration phase of the positive phase capacitor is opposite to that of the negative phase capacitor, the vibration of the capacitors can be canceled if the positive phase capacitor and the negative phase capacitor are arranged closely to each other on the upper surface or lower surface of the circuit board. Therefore, the circuit board is not vibrated or the acoustic noise does not occur from the circuit board even if the capacitors are vibrated.

[Principle of Prevention of Acoustic Noise]

Figure 4A:
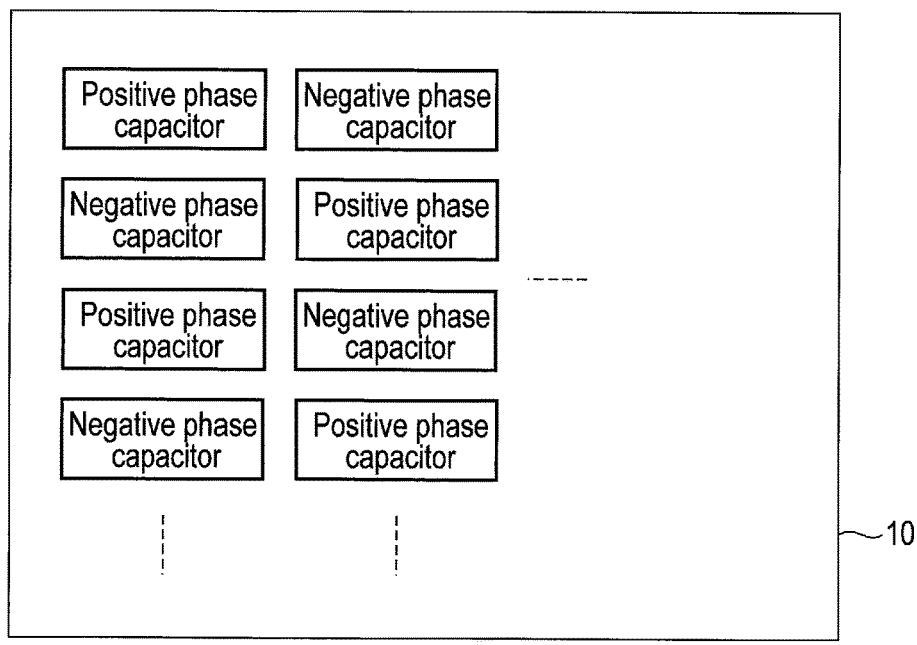
FIG. 4A is a diagram illustrating an arrangement of a positive-phase capacitor and a negative-phase capacitor.
Figure 4B:
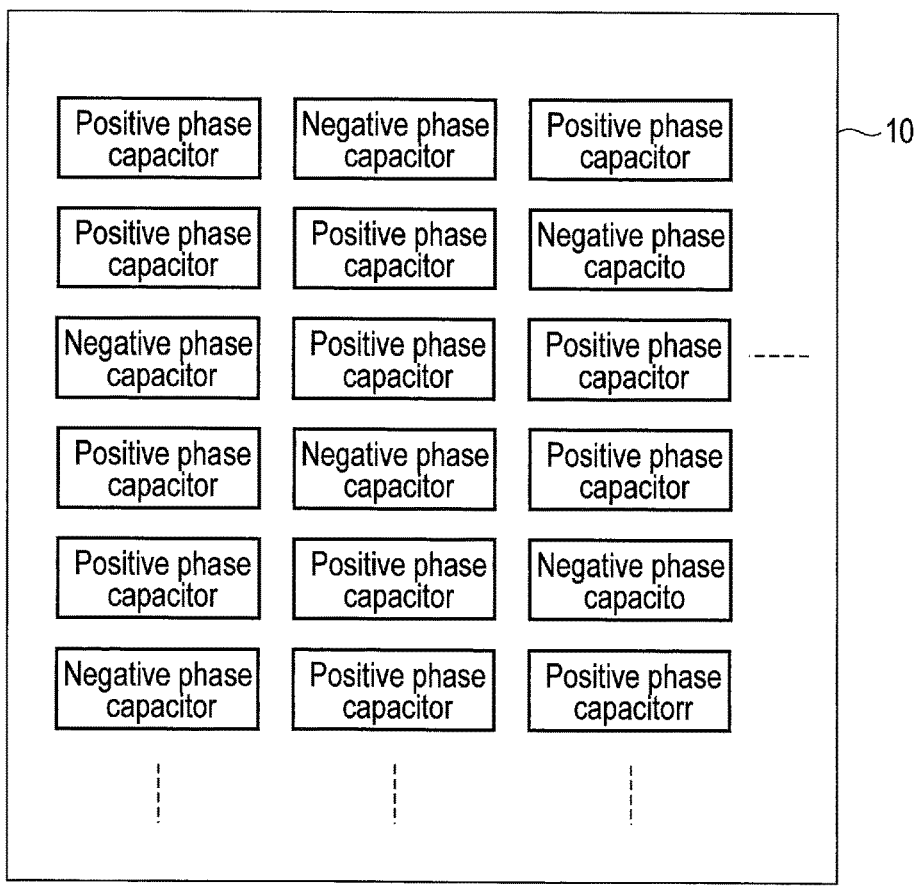
FIG. 4B is a diagram illustrating another arrangement of the positive-phase capacitor and the negative-phase capacitor.

FIG. 4A and FIG. 4B show an example of proximate arrangement of the positive phase capacitor and the negative phase capacitor on the circuit board 10. In FIG. 4A and FIG. 4B, a number of positive phase capacitors and negative phase capacitors are arranged in a two-dimensional array. The positive phase capacitors and the negative phase capacitors are arranged alternately in any of column and row directions. If the number is less than the number shown in FIG. 4A and FIG. 4B, the capacitors may be arranged in a one-dimensional array in either of column and row directions, and the positive phase capacitors and the negative phase capacitors are arranged alternately in either of column and row directions. If one positive phase capacitor and one negative phase capacitor are arranged, the capacitors are arranged closely to each other or adjacent to each other.

FIG. 4A is based on an assumption that the voltage vibrations of the positive phase capacitor and the negative phase capacitor are the same (the absolute values of the voltage variations are the same while phases of the voltage variations are opposed to each other). If the voltage vibrations of the positive phase capacitor and the negative phase capacitor are not the same, the positive phase capacitors and the negative phase capacitors whose number correspond to a ratio of the voltage vibrations of the positive phase capacitor and the negative phase capacitor are arranged alternately. For example, if one negative phase capacitor and two positive phase capacitor are alternately arranged in the row direction and/or column direction as shown in FIG. 4B in a case where the absolute value of the voltage vibration of the negative phase capacitor is double the absolute value of the voltage vibration of the positive phase capacitor, the vibration of the positive phase capacitor and the vibration of the negative phase capacitor are approximately canceled.

In the capacitor shown in FIG. 4A and FIG. 4B, a pair of external electrodes 16a and 16b may be arranged in an orientation of being positioned on the right and left ends or upper and lower ends of the drawings.

A concrete example of the positive phase capacitors and the negative phase capacitors will be explained.

For example, if a PWM dimming signal is changed from a low level to a high level (the PWM dimming is changed from "off" to "on") in a PWM dimming LED drive circuit according to a first embodiment to be explained later, a voltage of at least one first capacitor electrically connected to the power input side is reduced while a voltage of at least one second capacitor electrically connected to the power output side is increased. In contrast, if the PWM dimming signal is changed from the high level to the low level (the PWM dimming is changed from "on" to "off"), the voltage of the at least one first capacitor is increased while the voltage of the at least one second capacitor is reduced. In the PWM dimming LED drive circuit, the first capacitor and the second capacitor therefore serve as the positive phase capacitor and the negative phase capacitor, respectively, and the acoustic noise from the circuit board 10 at the PWM dimming can be reduced by arranging the first and the second capacitors closely to each other as shown in FIG. 4A and FIG. 4B.

The capacitor provided in the electronic device does not necessarily include the positive phase capacitor and the negative phase capacitor. If a dummy capacitor is provided and a voltage is applied to the dummy capacitor via an inverting circuit in a case where the voltage variation characteristic of the capacitor provided in the electronic device has a single phase, the phase of the voltage variation characteristic of the dummy capacitor and the phase of the voltage variation characteristic of the initially mounted capacitor other than the dummy capacitor are opposite to each other. If a capacitor (positive phase) 54a of only one type is mounted in the device, a dummy capacitor 54b is added as shown in FIG. 5A.

An input voltage Vi is applied directly to the capacitors (positive phase) 54a (54a-1, 54a-2, 54a-3, . . . ). The input voltage Vi is applied to the dummy capacitors (negative phase) 54b (54b-1, 54b-2, 54b-3, . . . ) via an inverting circuit formed of an operational amplifier 52. The input voltage Vi is supplied to an inverted input terminal (− terminal) of the operational amplifier 52 via an input resistor R. An output terminal of the operational amplifier 52 is electrically connected to the inverted input terminal (− terminal) via a feedback resistor. When the power source voltage of the operational amplifier 52 is Vcc and a voltage of a non-inverted input terminal (+ terminal) is Vcc/2, an output voltage Vo of the operational amplifier 52 is Vo=Vcc−Vi.

FIG. 5B shows the voltage variation characteristics of the capacitor (positive phase) 54a and the dummy capacitor (negative phase) 54b. For example, if Vcc is 5V, the voltage of the initially mounted capacitor (positive phase) 54a is varied in a range between 4.0V and 3.0V while the voltage of the additionally mounted dummy capacitor (positive phase) 54b is varied in a range between 1.0V and 2.0V with reference to Vcc/2=2.5V. In other words, the voltage Vo (=Vcc−Vi) of the dummy capacitor (negative phase) 54b and the voltage Vi of the capacitor (positive phase) 54a are represented by substantially symmetrical waveforms with reference to Vcc/2=2.5V.

For this reason, the vibration from the capacitor 54a and the vibration from the dummy capacitor 54b can be canceled and the acoustic noise does not occur from the circuit board, by arranging the capacitor (positive phase) 54a and the dummy capacitor (negative phase) 54b similarly to the positive phase capacitor and the negative phase capacitor shown in FIG. 4A and FIG. 4B.

First Embodiment

The present invention can be applied to various devices including a ceramic capacitor. An LED drive circuit will be explained as the first embodiment. FIG. 6 is a circuit diagram of the LED drive circuit. A power source voltage Vin is electrically connected to an end of a coil L1 via a fuse F1. A first capacitor $C1_1$ electrically connected to the power input side may be electrically connected between a referential potential (for example, an earth potential) and a line between the fuse F1 and the coil L1. Alternately, at least two first capacitors $C1_1$ to $C1_m$ electrically connected to the power input side may be electrically connected parallel between the referential potential and the line between the fuse F1 and the coil L1. For example, the power source voltage Vin is approximately 12V for vehicle use and is in a range from 5V to 6V for a mobile device. The other end of the coil L1 is electrically connected to an anode of a diode D1 and also electrically connected to a step-up switch Q1 formed of a MOS transistor via an LX terminal of an LED driver 62.

The LED driver 62 can be formed into an IC but does not necessarily need to be formed into an IC. A cathode of the diode D1 is electrically connected to an anode line. A second capacitor $C2_1$ electrically connected to the power output side may be electrically connected between the anode line and a referential potential (for example, the earth potential). Alternately, at least two second capacitors $C2_1$ to $C2_n$ electrically connected to the power output side may be electrically connected parallel between the anode line and the referential potential.

The step-up switch Q1 repeats turning on and off in accordance with a predetermined switching frequency by a switch control circuit 64 of the LED driver 62. For example, the switching frequency is approximately 500 kHz to 2 MHz. When the step-up switch Q1 is turned on, current flows through the coil L1. The coil L1 is charged with energy. When the step-up switch Q1 is turned off, the energy stored in the coil L1 is supplied to the second capacitor C2 ($C2_1$ to $C2_n$) via the diode D1 and the second capacitor C2 ($C2_1$ to $C2_n$) is charged with the energy. Thus, since the second capacitor C2 ($C2_1$ to $C2_n$) is charged with the energy stored in the coil L1 via the diode D1 every time the step-up switch Q1 repeats turning on and off, the second capacitor C2 ($C2_1$ to $C2_n$) is charged with a voltage higher than the power source voltage Vin. The coil L1, the step-up switch Q1, the diode D1, and the second capacitor C2 ($C2_1$ to $C2_n$) constitute a step-up chopper circuit of a switching regulator type.

A plurality of (for example, two) LED strings formed of a plurality of (for example, ten) LEDs electrically connected in series are electrically connected to the anode line. Anodes of LEDs at one ends of the LED strings are electrically connected to the anode line and cathodes of LEDs at the other ends of the LED strings are electrically connected to an LED current control circuit 70 via cathode lines, and terminals $LED_1$ and $LED_2$ of the LED driver 62. If the voltage of the anode line becomes higher than a threshold voltage of the LED strings, the current flows to the LED strings and the LEDs emit light. For example, the threshold voltage of each LED is approximately 3V. Therefore, the LED strings emit light when the voltage of the anode line becomes approximately 30V in a case where, for example, ten LEDs are electrically connected serially to form each LED string.

Since plural LED strings are electrically connected parallel, all the LED strings emit light similarly when the anode line is applied with approximate 30V. The current flowing to the LED strings is monitored by the LED current control circuit 70 via the cathode lines and fed back to the switch control circuit 64 to become a preset current value. The switch control circuit 64 turns on and off the step-up switch Q1 according to the feedback control. The constant current flows through the LEDs at any time and allows light to be emitted with constant brightness, under this sequence of control.

Since the LED driver 62 thus controls turning on and off the step-up switch Q1 and outputs the voltage higher than the power source voltage Vin to the anode line, the LED strings may generate malfunction if an operation error occurs and the LED driver runs away. Thus, the LED drive circuit includes a resistor diving circuit formed of resistors R1 and R2 for setting overvoltage protection (OVP) in the anode line and monitors a voltage at the connection point of the resistors R1 and R2. The monitor voltage is input to an OVP terminal of the LED driver 62 and compared with a reference value Vovp by a comparator 66. If the monitor voltage becomes larger than the reference value Vovp, the switch control circuit 64 is controlled by an overvoltage protection circuit 68 and the switching operation of the step-up switch Q1 is stopped.

A voltage Va of the anode line at which the overvoltage protection circuit 68 operates and the switching operation of the set-up switch Q1 is stopped is calculated as follows.

$$Va=(1+(R1/R2))\times Vovp$$

For example, the voltage Va of the anode line at which the overvoltage protection circuit operates becomes 37.2V when R1 is 900 kΩ, R2 is 30 kΩ and Vovp is 1.2V. Since the maximum value of the threshold of the LED is approximately 3.5V, the voltage of the anode line becomes approximately 35V at most even if the LED string is formed of ten serial LEDs. For this reason, no problem occurs if the overvoltage protection circuit operates at 37.2V. The reference value Vovp is set to be approximately in a range from 1V to 2V. This is because the voltage in a range from approximately 1V to 2V can easily be generated from a band gap voltage even if the LED driver 62 is formed into an IC.

As the method of adjusting the brightness of the LEDs in such an LED drive circuit, two methods, i.e., analog dimming and digital dimming (PWM dimming) are generally employed. The analog dimming is a method of adjusting the brightness by varying a value of an LED current setting resistor R4 of the LED current control circuit 70, inside the LED driver 62, and varying the LED current. However, since variation in the value of the LED current setting resistor R4 is large, the brightness can hardly be adjusted with good accuracy by the analog dimming. In addition, linearity of the current/brightness characteristic of the LEDs of the analog dimming is not good.

In contrast, the digital dimming (hereinafter called PWM dimming) is a method of adjusting the brightness by controlling the LEDs to be turned on and off, based on a pulse width modulation (PWM) signal. Thus, the linearity of the brightness characteristic is good, and the brightness of the LEDs can be adjusted with extremely high accuracy. The brightness can be adjusted even if the duty ratio of the dimming signal (on/off ratio, also called a dimming ratio) is below 1%. Recently, the PWM dimming is frequently used as adjustment of the LED brightness.

The PWM dimming signal for the adjustment of the LED brightness which is input to the LED driver 62 is a rectangular wave signal at which binary levels of a high level (for example, 3.3V) and a low level (for example, 0V) are repeated. If the PWM dimming signal is the high level, the switch control circuit 64 supplies a drive signal of a predetermined switching frequency to a gate of the step-up switch Q1, and the step-up switch Q1 is repeatedly turned on and off. The PWM dimming is thereby turned on, the current flows through the LED strings and the LED strings emit light. For example, the switching frequency is approximately in a range from 500 kHz to 2 MHz. If the PWM dimming signal is the low level, the transistor Q1 is turned off by the switch control circuit 64, the operation of the step-up chopper circuit of the switching regulator type is stopped, the voltage value of the anode line is lowered, the voltage applied to the LEDs is made lower than or equal to the threshold voltage and the light of the LED string is put out. In other words, the PWM dimming is turned off.

The light emission intensity of the LEDs is varied and the brightness of the LEDs can be adjusted by turning on and off the PWM dimming and thus turning on and off the LEDs in accordance with the level of the PWM dimming signal. For example, the frequency of the PWM dimming signal is approximately in a range from 100 Hz to 2 kHz such that flicker of turning on and off the LEDs is invisible to a human eye. If the frequency of the PWM dimming signal is high, turning on and off the LEDs cannot follow the change in level of the PWM dimming signal and the linearity of the brightness characteristic often becomes worse (particularly in a case where the dimming rate which is an on/off ratio of the PWM dimming is 1% or less). Therefore, the PWM dimming signal of approximately 200 Hz is often used.

In this LED drive circuit, if the step-up chopper circuit of the switching regulator type repeats operation and stop by the PWM dimming signal, flow and stop of the input current based on the power source voltage Vin are repeated, and the voltage of the first capacitor C1 ($C1_1$, $C1_2$, . . . $C1_m$) electrically connected to the power input side is varied. For example, if four LED strings each formed of ten serially electrically connected LEDs are electrically connected parallel to the anode line, the anode voltage becomes 30V+ VLEDk (=3V×10+VLEDk) and the anode current becomes 340 mA (=85 mA×4) where the current flowing in one LED string is 85 mA and a threshold voltage of the LEDs is 3V. VLEDk represents a voltage of terminal LEDk (k is the number of LED strings) of the LED driver 62 when the step-up chopper circuit in a switching regulator style operates. If turning on and off the LEDs are repeated, flow and stop of the input current Iin supplied from Vin are repeated.

Figure 7:
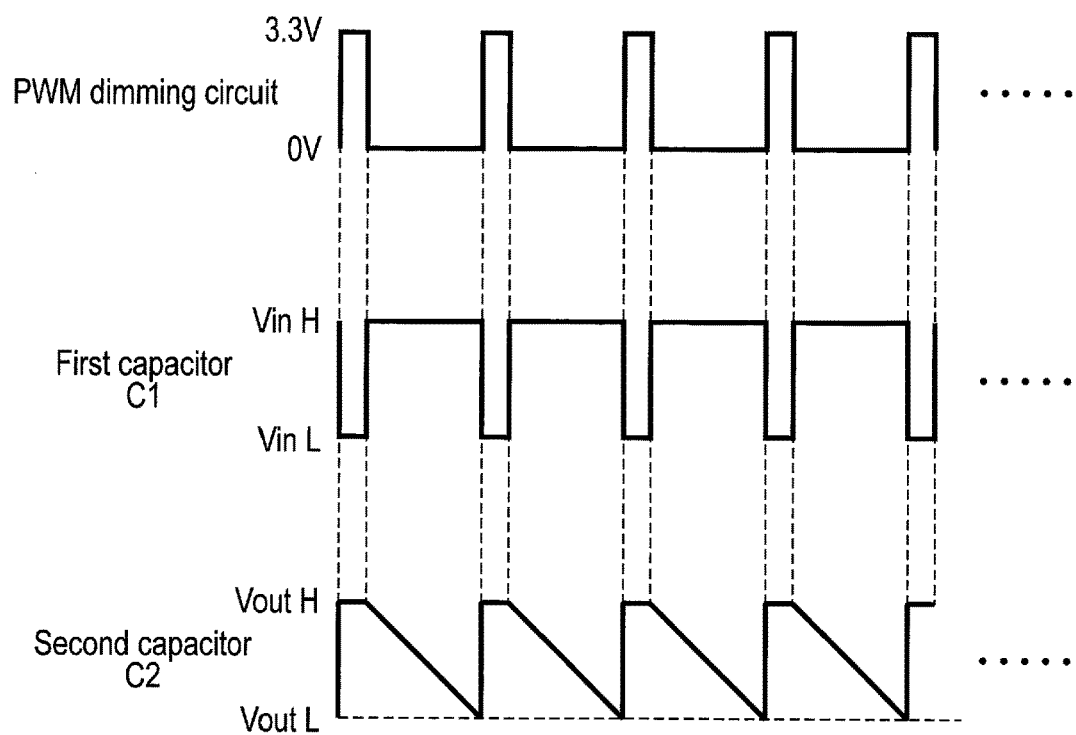
FIG. 7 is a diagram illustrating an example of voltage variation of a first capacitor electrically connected to a power source input side and a second capacitor electrically connected to a power source output side, for a PWM dimming signal in FIG. 6.

It is assumed that the power source voltage Vin is represented by Vin H (for example, 12V) and a resistor value of a wiring cable which supplies the power source voltage Vin is 1Ω. The voltage of the first capacitor C1 ($C1_1$, $C1_2$, . . . $C1_m$) electrically connected to the power input side drops (=Iin×1Ω) and becomes Vin L due to the wiring resistance when the PWM dimming signal is the on level. No current flows and the voltage does not drop but becomes Vin H when the PWM dimming signal is off. As a result, the voltage of the first capacitor C1 ($C1_1$, $C1_2$, . . . $C1_m$) has a voltage waveform as shown in FIG. 7 in accordance with the level of the PWM dimming signal.

The voltage of the second capacitor C2 ($C2_1$, $C2_2$, . . . $C2_n$) electrically connected to the power output side is also varied in accordance with the level of the PWM dimming signal. This is because since the operation of the step-up chopper circuit in a switching regulator style is stopped, control of the feedback loop using the LEDs is not executed and the voltage control of the terminal LEDk of the LED driver 62 is no longer executed. In addition, since the OVP setting resistors R1 and R2 for overvoltage protection are electrically connected to the anode line, the voltage of the anode line is discharged to the GND due to the leak current of the resistors R1 and R2 and the voltage drop becomes large when the PWM dimming signal is at the low level and the step-up operation is stopped.

In the conventional LED drive circuit, it is proposed that the values of the resistors R1 and R2 are set to be as large as possible to reduce as much voltage drop as possible. However, if the values of the resistors R1 and R2 are set to be remarkably large, input impedance of the comparator 66 in the LED driver 62 cannot be neglected and an operation error of the overvoltage protection circuit 68 may occur. For this reason, it is recommended that the values of the resistors R1 and R2 are set to be 1MΩ or less. However, the leak current cannot be sufficiently suppressed and the voltage drop cannot be avoided.

If the PWM dimming signal becomes the high level, the step-up operation is restarted and the voltage is therefore recovered to the level at which the reset LED current flows. Since the above-explained operations are repeated in accordance with the level of the PWM dimming signal, the voltage of the second capacitor C2 ($C2_1$, $C2_2$, . . . $C2_n$) electrically connected to the anode line is varied similarly to a triangular wave shown in FIG. 7 in accordance with the level of the PWM dimming signal. Since the voltage of the first capacitor C1 ($C1_1$, $C1_2$, . . . $C1_m$) and the voltage of the second capacitor C2 ($C2_1$, $C2_2$, . . . $C2_n$) are different in polarity when the PWM dimming is turned on, the phase of the first capacitor C1 ($C1_1$, $C1_2$, . . . $C1_m$) is opposite to the phase of the voltage of the second capacitor C2 ($C2_1$, $C2_2$, . . . $C2_n$) are different. FIG. 7 shows a case where the threshold value of the LEDs is 3V and the anode voltage drops from Vout H to Vout L. The value of the voltage drop becomes large or small under conditions (resistors R1 and R2, PWM frequency and the like).

As explained above, if the PWM dimming is executed in the LED drive circuit, the voltages of both the first capacitor C1 ($C1_1$, $C1_2$, . . . $C1_m$) and the second capacitor C2 ($C2_1$, $C2_2$, . . . $C2_n$) are varied with the frequency of the PWM dimming signal, for example, a low frequency of 200 Hz. If the voltage variation occurs in the ceramic capacitor with a low frequency of approximately 200 Hz, the circuit board 10 on which the ceramic capacitor is formed resonates and large acoustic noise occurs from the circuit board 10.

Figure 8:
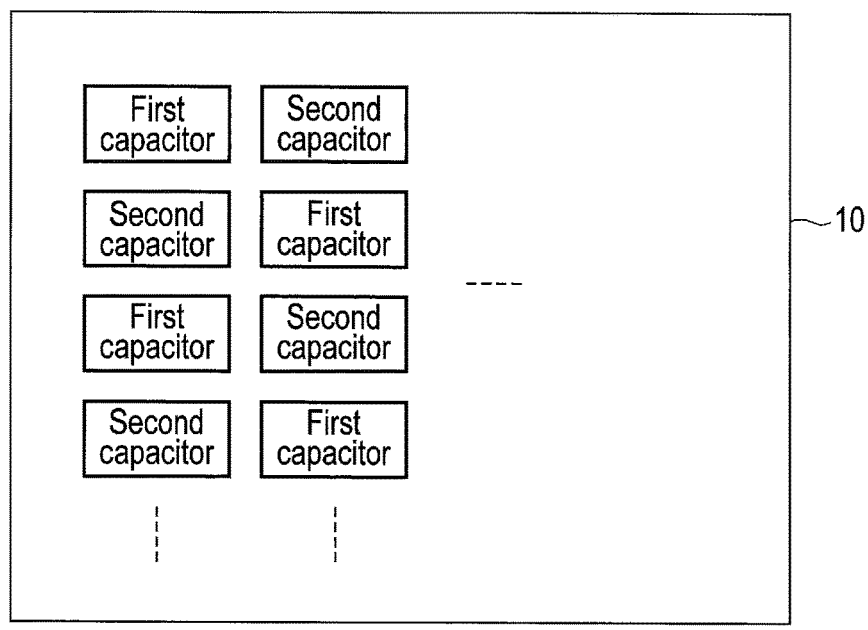
FIG. 8 is a diagram illustrating arrangement of first capacitor and second capacitor according to the embodiment.

In the present embodiment, the first capacitors and the second capacitors of the LED drive circuit are arranged closely to each other on the upper surface or the lower surface of the circuit board 10 so as to cancel the vibration between the capacitors as shown in FIG. 8. If the number of the first capacitors and the number of the second capacitors are two or more, the first capacitors and the second capacitors are arranged alternately in either the columnar direction or the row direction. If the number of the first capacitors and the number of the second capacitors are further plural, the first capacitors and the second capacitors are arranged alternately in both the columnar direction and the row direction. The phase of the voltage variation of the first capacitor caused by the PWM dimming is opposite to the phase of the voltage variation of the second capacitor caused by the PWM dimming. Therefore, the vibration from the first capacitor and the vibration from the second capacitor are canceled. The variation of the circuit board 10 caused by extension and shrinkage of the capacitors is suppressed. Occurrence of the acoustic noise from the circuit board 10 caused by the PWM dimming is reduced by arranging the capacitors closely to each other on one of the surfaces of the circuit board 10.

The phase of the voltage variation of the first capacitor C1 ($C1_1$, $C1_2$, . . . $C1_m$) and the second capacitor C2 ($C2_1$, $C2_2$, . . . $C2_n$) generated by the PWM dimming in the LED drive circuit will be explained with reference to FIG. 9 and FIG. 10. A portion represented by a broken line in FIG. 9 indicates voltage variation in a case where the PWM dimming signal is changed from the low level to the high level (LEDs are changed from "off" to "on"). If the PWM dimming signal is changed from the low level to the high level, the voltage of the first capacitor C1 ($C1_1$, $C1_2$, . . . $C1_m$) becomes small (Vin H to Vin L) and the size of the first capacitor C1 ($C1_1$, $C1_2$, . . . $C1_m$) increases laterally (or horizontally) since the step-up chopper operates, a large input current starts flowing and the voltage drop occurs due to the wiring resistance. In contrast, the voltage of the second capacitor C2 ($C2_1$, $C2_2$, . . . $C2_n$) becomes large (Vout L to Vout H) and the size of the second capacitor C2 ($C2_1$, $C2_2$, . . . $C2_n$) shrinks laterally since the voltage lowered due to a leak current from the OVP setting resistors R1 and R2 is increased by activation of the step-up chopper.

In contrast, if the PWM dimming signal is changed from the high level to the low level (LEDs are changed from "on" to "off") as shown in FIG. 10, the step-up chopper stops and the input current runs out, the voltage of the first capacitor C1 ($C1_1$, $C1_2$, . . . $C1_m$) becomes large (Vin L to Vin H) and the size of the first capacitor C1 shrinks laterally while the voltage of the second capacitor C2 ($C2_1$, $C2_2$, . . . $C2_n$) becomes small (Vout H to Vout L) due to the leak current from the OVP setting resistors R1 and R2 and the size of the second capacitor C2 extends laterally.

Figure 11:
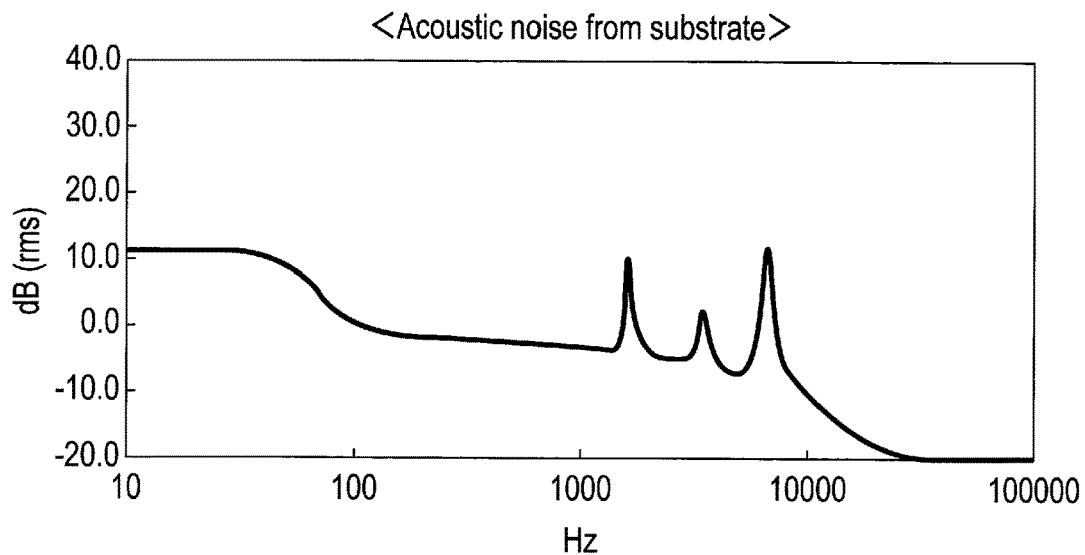
FIG. 11 is a graph illustrating an example of frequency characteristics of the acoustic noise of a circuit substrate according to the embodiment.

Thus, the phase is inverted in the voltage variation of the first capacitor C1 ($C1_1$, $C1_2$, . . . $C1_m$) and the second capacitor C2 ($C2_1$, $C2_2$, . . . $C2_n$). In other words, the second capacitor C2 ($C2_1$, $C2_2$, . . . $C2_n$) shrinks laterally when the first capacitor C1 ($C1_1$, $C1_2$, . . . $C1_m$) extends laterally and the second capacitor C2 ($C2_1$, $C2_2$, . . . $C2_n$) extends laterally when the first capacitor C1 ($C1_1$, $C1_2$, . . . $C1_m$) shrinks laterally. Therefore, an influence of distortion to the circuit board 10 can be reduced, and the deformation of the circuit board 10 becomes smaller than that in the prior art and occurrence of the acoustic noise from the circuit board can be reduced by arranging the first capacitor C1 ($C1_1$, $C1_2, \ldots C1_m$) and the second capacitor C2 ($C2_1, C2_2, \ldots C2_n$) adjacent to each other as shown in FIG. 8. FIG. 11 shows a measurement result of the acoustic noise from the circuit board 10 in a case where the frequency of the PWM dimming signal is 200 Hz. In general, a human audible frequency range is a range from 20 Hz to 20 kHz and the human can hear sounds at a magnitude of 10 dB or more. It can be understood that the components of 10 dB or more are frequently appeared in a range from 3 kHz to 12 kHz as shown in FIG. 3 and the acoustic noise occurs in the prior art while most of the components are reduced to 10 dB or less in the present embodiment as shown in FIG. 11. The fact that the frequency components of the acoustic noise are in a range from 3 kHz to 12 kHz although the PWM dimming frequency is 200 Hz is related with the resonance to the material of the circuit board and the resonance to the surrounding object.

According to the first embodiment, as explained above, at least one first capacitor and at least one second capacitor in which the phase is inverted in the voltage variation are arranged adjacent to each other on the upper surface or the lower surface of the circuit board in the LED drive circuit. Therefore, vibration based on deformation of both of the first and second capacitors can be canceled and the acoustic noise from the circuit board can be prevented. If a large number of the first capacitors and the second capacitors are provided, the effect of canceling the vibration can be further increased by alternately arranging the first capacitors and second capacitors in array.

Second Embodiment

Figure 12:
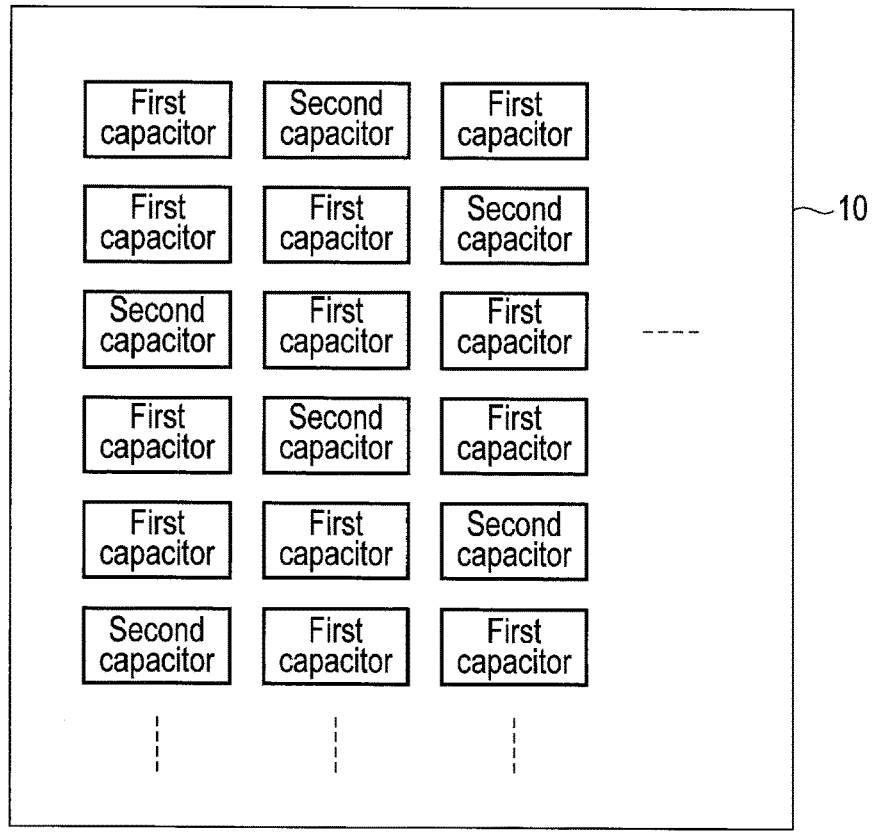
FIG. 12 is a diagram illustrating arrangement of first capacitor and the second capacitor according to a second embodiment.

In the first embodiment, if a large number of the first capacitors and the second capacitors are provided, alternate arrangement is indicated as an example of adjacent arrangement of the first capacitors and the second capacitors as shown in FIG. 8. As explained with reference to FIG. 4A and FIG. 4B, it is also assumed that the first capacitor and the second capacitor have the same voltage variation value (absolute value) in FIG. 8. If the first capacitors and the second capacitors are different in voltage variation, the first capacitors and the second capacitors whose number corresponds to the ratio of voltage values are arranged alternately. In the first embodiment, for example, it is assumed that the first capacitors and the second capacitors are the same in voltage variation as shown in FIG. 8. However, in general, the voltage variation values are not the same. The first capacitors and the second capacitors are arranged in two-dimensional array such that, for example, if the voltage variation of the first capacitors is 1V and the voltage variation of the second capacitors is 2V, each second capacitor is arranged alternately with two first capacitors on the upper surface or lower surface of the circuit board 10 as shown in FIG. 12.

If one first capacitor is arranged alternately with one second capacitor, the one first capacitor can compensate for only half of the size variation amount of the second capacitors since the size variation amount of the second capacitors is twice as large as the first capacitor. In contrast, if the number of the first capacitors is set at twice the number of the second capacitors, the first capacitors can substantially compensate for the size variation amount of the second capacitors and the acoustic noise can be therefore reduced.

Third Embodiment

In the first and second embodiments, the phase of the voltage variation of the first capacitor is opposite to the phase of the second capacitor, as shown in FIG. 7 but the waveform of the voltage variation of one of the first capacitor and the second capacitor is a rectangular waveform and the waveform of the voltage variation of the other of the first capacitor and the second capacitor is a saw tooth waveform. Thus, the reversed waveform of the voltage variation of the first capacitor and the waveform of the second capacitor are not exactly same to each other. A third embodiment using two types of capacitors in which the waveform of the voltage variation of the first capacitor is opposite to the waveform of the voltage variation of the second capacitor will be explained.

Figure 13:
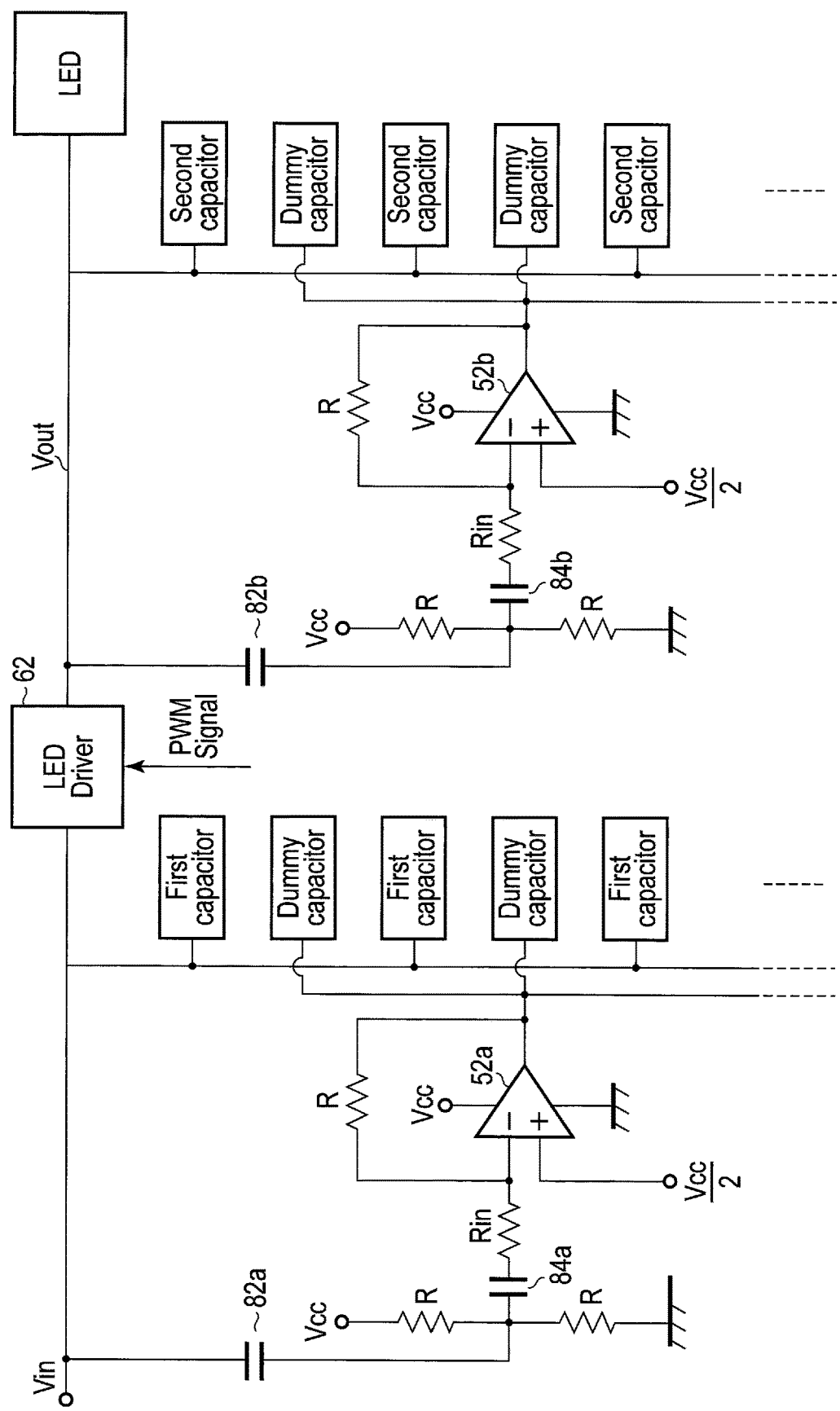
FIG. 13 is a block diagram illustrating an example of an inverting circuit electrically connected to an input side of a dummy capacitor according to a third embodiment.

FIG. 13 is an example of the circuit diagram. An inverting circuit formed of an operational amplifier 52a is electrically connected to a power line (Vin line) on an input side of the LED driver 62 via an AC coupling capacitor 82a. An inverting circuit formed of an operational amplifier 52b is electrically connected to an anode line on an output side of the LED driver 62 via an AC coupling capacitor 82b. At least one first dummy capacitor is provided near at least one first capacitor to which a power source voltage Vin is applied. An output of the inverting circuit 52a on the input side is electrically connected to the at least one first dummy capacitor. At least one second dummy capacitor is also provided near at least one second capacitor to which an output voltage Vout of the LED driver 62 is applied. An output of the inverting circuit 52b on the output side is electrically connected to the at least one second dummy capacitor.

The power source voltage terminal Vin is electrically connected to an inverted input terminal (− terminal) of the operational amplifier 52a via the AC coupling capacitor 82a, a capacitor 84a, and an input resistor Rin. A connection point between the AC coupling capacitor 82a and the capacitor 84a is electrically connected to each of a power Vcc terminal via a resistor R and a reference power (ground) terminal via a resistor R. A non-inverted input terminal (+ terminal) of the operational amplifier 52a is electrically connected to a voltage terminal Vcc/2. An output terminal of the operational amplifier 52a is electrically connected to the at least one first dummy capacitor. An output terminal of the operational amplifier 52a is electrically connected to the inverted input terminal (− terminal) via a resistor R.

An output voltage Vout terminal of the LED driver 62 is electrically connected to an inverted input terminal (− terminal) of the operational amplifier 52b via an AC coupling capacitor 82b, a capacitor 84b, and an input resistor Rin. A connection point between the AC coupling capacitor 82b and the capacitor 84b is electrically connected to each of a power terminal Vcc via a resistor R and a reference power (ground) terminal via a resistor R. A non-inverted input terminal (+ terminal) of the operational amplifier 52b is electrically connected to a voltage terminal Vcc/2. An output terminal of the operational amplifier 52b is electrically connected to the at least one second dummy capacitor. An output terminal of the operational amplifier 52b is electrically connected to the inverted input terminal (− terminal) via a resistor R.

Figure 14A:
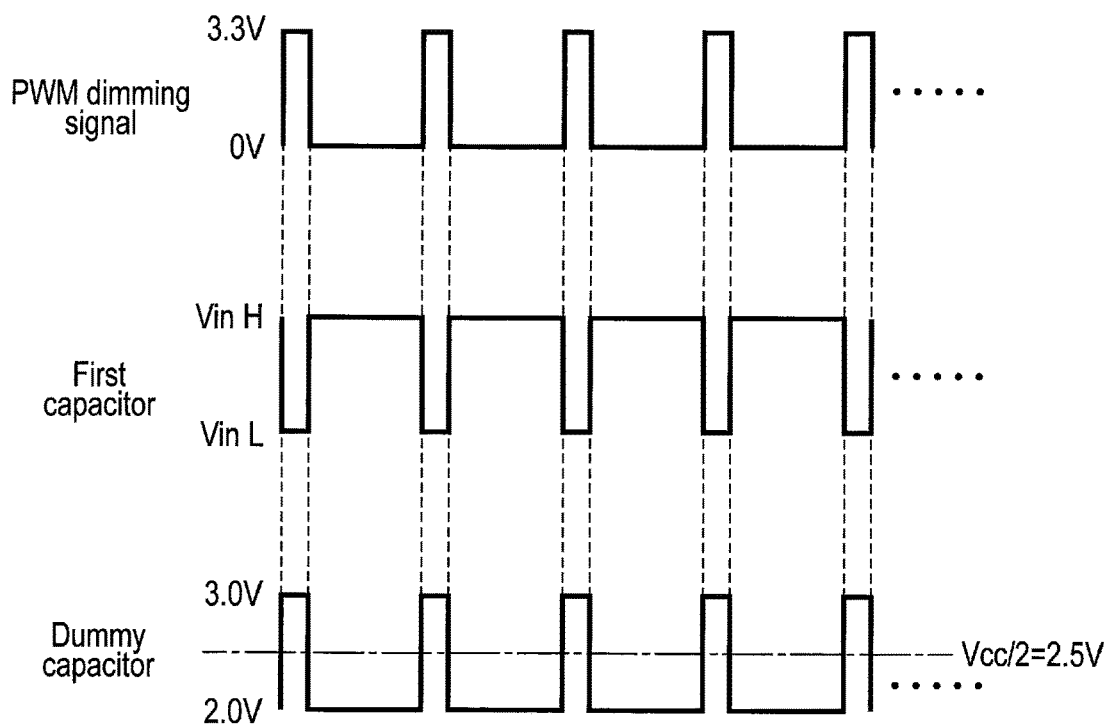
FIG. 14A is a diagram illustrating an example of voltage variation in the first capacitor for the PWM dimming signal shown in FIG. 13.
Figure 14B:
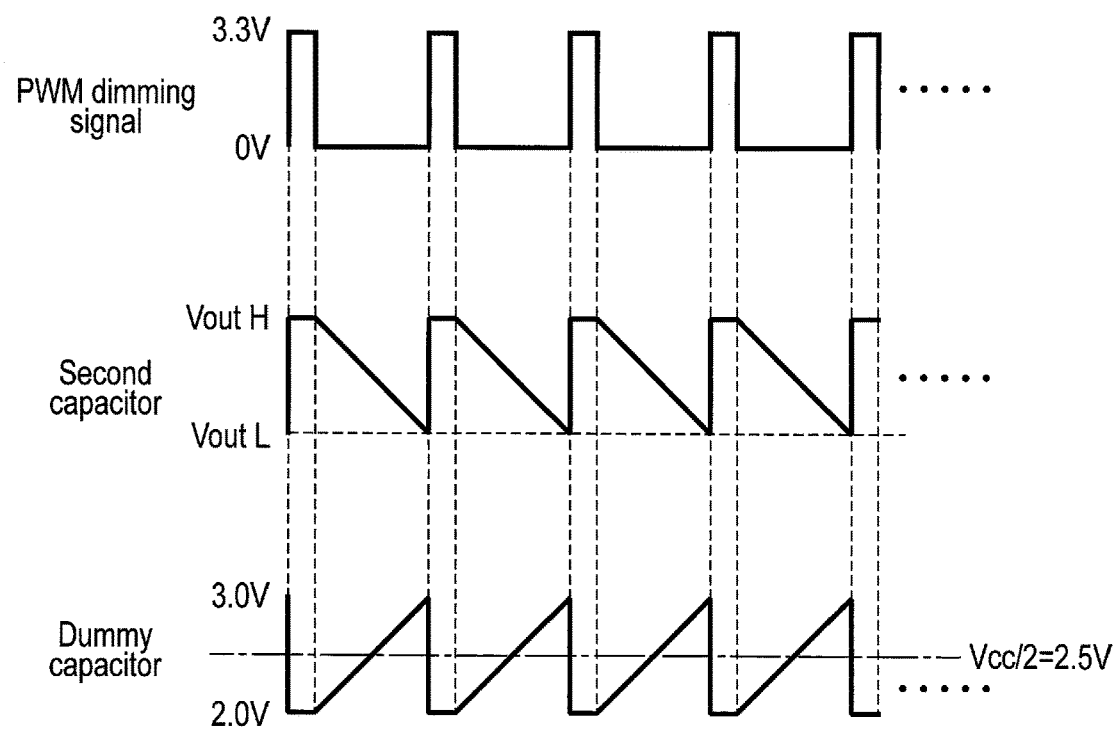
FIG. 14B is a diagram illustrating an example of voltage variation in the second capacitor for the PWM dimming signal shown in FIG. 13.

For example, if the input voltage is 12V (output voltage is 30V) similarly to a vehicle-mounted LED drive circuit or the like, the inverting circuits shown in FIG. 13 are used to invert the AC component alone since an operational amplifier inverter of 5V power cannot be used. As shown in FIG. 14A and FIG. 14B, the output of the input-side operational amplifier 52a is the AC component of Vout=Vcc−Vin and the output of the output-side operational amplifier 52b is the AC component of Vout=Vcc−(anode voltage). The voltage variation characteristic of the first capacitor (or the second capacitor) is therefore opposite to the voltage variation characteristic of the dummy capacitor in the phase and waveform.

Thus, if the dummy capacitor is provided near the first and second capacitors that are mounted originally and the voltage supplied to the first and second capacitors is supplied to the dummy capacitor via the inverting circuit which inverts the AC component alone, the voltage variation of the first and the second capacitors is opposite to the voltage variation of the dummy capacitor in the phase and the waveform. The arrangement of the first capacitor (or the second capacitor) and the dummy capacitor may be an arrangement in which the positive phase capacitor (or the negative phase capacitor) is replaced with the first capacitor (or the second capacitor) and the negative phase capacitor (or the positive phase capacitor) is replaced with the dummy capacitor in FIG. 4A and FIG. 4B.

Fourth Embodiment

FIG. 15 shows another example of an electronic circuit including the positive capacitor and the second capacitor. The LED drive circuit in FIG. 6 steps up the power source voltage by the switching regulator. The example of the step-up circuit is not limited to the switching regulator but may be a three-terminal regulator shown in FIG. 15.

At least one first capacitor C1 is electrically connected between a power source voltage Vin and a reference voltage (grounded voltage). The power source voltage Vin serves as power of an operational amplifier 102. A non-inverted input terminal (+ terminal) of the operational amplifier 102 is electrically connected to an input voltage E while an inverted input terminal (− terminal) is electrically connected to the reference voltage (grounded voltage) via a resistor 106. An output terminal of the operational amplifier 102 is electrically connected to the inverted input terminal (− terminal) via a feedback resistor 108. An output of the operational amplifier 102 is electrically connected to an output terminal Vout via an output resistor 110. At least one second capacitor C2 is electrically connected to the output terminal Vout.

If the first capacitor C1 and the second capacitor C2 are used with a frequency by which the phase of the voltage variation of the first capacitor C1 is opposite to the phase of the voltage variation of the second capacitor C2, the resonance of substrate due to the vibration of the capacitors C1 and C2 and the acoustic noise occurring from the circuit board can be prevented by arranging the first and second capacitors C1 and C2 closely an alternately.

Fifth Embodiment

The LED drive circuit according to the first to fourth embodiments can be applied to various products, and a display device will be explained as an example of the LED drive circuit according to a fifth embodiment.

[Display Device]

FIG. 16 is a perspective view showing a schematic configuration example of an overall display device equipped with a touch detection function according to the embodiment. The display device includes a display panel including a touch detection mechanism together with a driving circuit and a control circuit of the display panel. A display panel using liquid crystal, a display panel using organic EL, and the like can be used as the display panel. For example, the display panel using the liquid crystal will be explained in the present specification. The liquid crystal display panel includes a pixel substrate on which thin film transistor (TFT) pixels are formed. The "touch detection" indicates detecting not only an object such as a human finger or a stylus contacting the display panel, but the object approaching the display panel. The "integrated type" indicates that the touch panel is not disposed externally on the display panel, but built in the display panel. The "built-in type" indicates the in-cell type in which a touch sensor is provided on a pixel substrate and the on-cell type in which a touch sensor is provided between a polarizer and a glass substrate for formation of a color filter. An in-cell touch sensor will be explained in the embodiment, but the present invention can also be applied to an on-cell touch sensor.

The display panel includes a first transparent substrate (also called a pixel substrate since pixels are formed in a matrix) 212 formed of glass resin or the like, a second transparent substrate (also called a counter-substrate) 214 formed of glass, resin or the like and disposed to be opposed to the first substrate 212, and a liquid crystal layer (not shown) formed between the first substrate 212 and the second substrate 214. The display panel is observed from the second substrate 214 side. For this reason, the second substrate 214 is also called an upper substrate while the first substrate 212 is also called a lower substrate.

The display panel is a rectangular flat plate, and a shorter side of the plate extends in the X direction while a longer side thereof extends in the Y direction. The size of the first substrate 212 and the size of the second substrate 214 are the same in the shorter side but different in the longer side. The first substrate 212 is longer than the second substrate 214 in the loner side. If one of the shorter sides of the first substrate 212 and one of the shorter sides of the second substrate 214 are aligned, the other of the shorter sides of the first substrate 212 locates outside of the second substrate 214. The first substrate 212 is protruded in the Y direction from the other of the shorter sides of the second substrate 214. A display control device 216 is mounted on an extension part (protruded part) of the first substrate 212. The display control device 216 may be formed into an IC. If the display control device 216 formed into an IC may be called a display controller IC.

A TFT pixel array 218 is formed in a display area (or an active area) in the center of the display panel. A touch panel 220 is integrated with the pixel array 218. The touch panel 220 includes a plurality of drive electrodes (drive electrodes for touch detection) provided on the first substrate 212 and a plurality of detection electrodes for touch detection provided on the second substrate 214. The drive electrodes are hereinafter called common electrodes since they serve as drive electrodes for display drive. The detection electrodes and the common electrodes are formed of, for example, a transparent conductive material such as indium tin oxide (ITO) or indium zinc oxide (IZO) not to affect the display.

On a capacitive touch sensor, when a drive pulse is supplied to the drive electrodes (common electrodes), an electric field is generated between the common electrodes and the other electrodes (detection electrodes). At this time, if a conductor such as a user's finger is in contact with or approaching the touch panel, an electric field is also generated between the conductor and the common electrodes, the electric field generated between the common electrodes and the detection electrodes is reduced, and the charge amount between the common electrodes and the detection electrodes is reduced. The touch position is detected by detecting the reduction in the charge amount by means of the detection electrodes.

A host device 226 is provided outside the display device. The display device and the host device 226 are electrically connected via two flexible printed circuits 228 and 232. The host device 226 is electrically connected to the first substrate 212 and the second substrate 214 via the flexible printed circuit 228. A touch detection device 234 controlling the touch panel 220 is disposed on the flexible printed circuit 228. The touch detection device 234 may be formed into an IC. The touch detection device formed into an IC is also called a touch controller IC.

The display control device 216 and the touch detection device 234 have cooperation with each other in operation timing, and are electrically connected to each other by means of the timing pulse and the like. The display control device 216 and the touch detection device 234 may not be different IC chip, but may be configured as the same IC chip.

A backlight unit 236 serving as an illumination device which illuminates the display panel is disposed on the lower side of the first substrate 212 (i.e., lower surface side of the display panel). The host device 226 is electrically connected to the backlight unit 236 via the flexible printed circuit 232. Various backlight units can be used as the backlight unit 236, and a light emitting diode (LED) (FIG. 6) is used here as a light source. An illumination device using a light guide disposed on the lower surface side of the display panel and an LED or a cold-cathode fluorescent tube disposed on the side edge of the light guide may be used. Alternatively, an illumination device using spotlight source in which light emitting elements are arranged on the lower surface side of the display panel may be used. The illumination device is not limited to the backlight, but a front light disposed on the display surface side of the display panel may be used as the illumination device. The display device also includes a secondary battery, a power supply circuit and the like though not illustrated in the drawing.

[Pixel Array]

Figure 17:
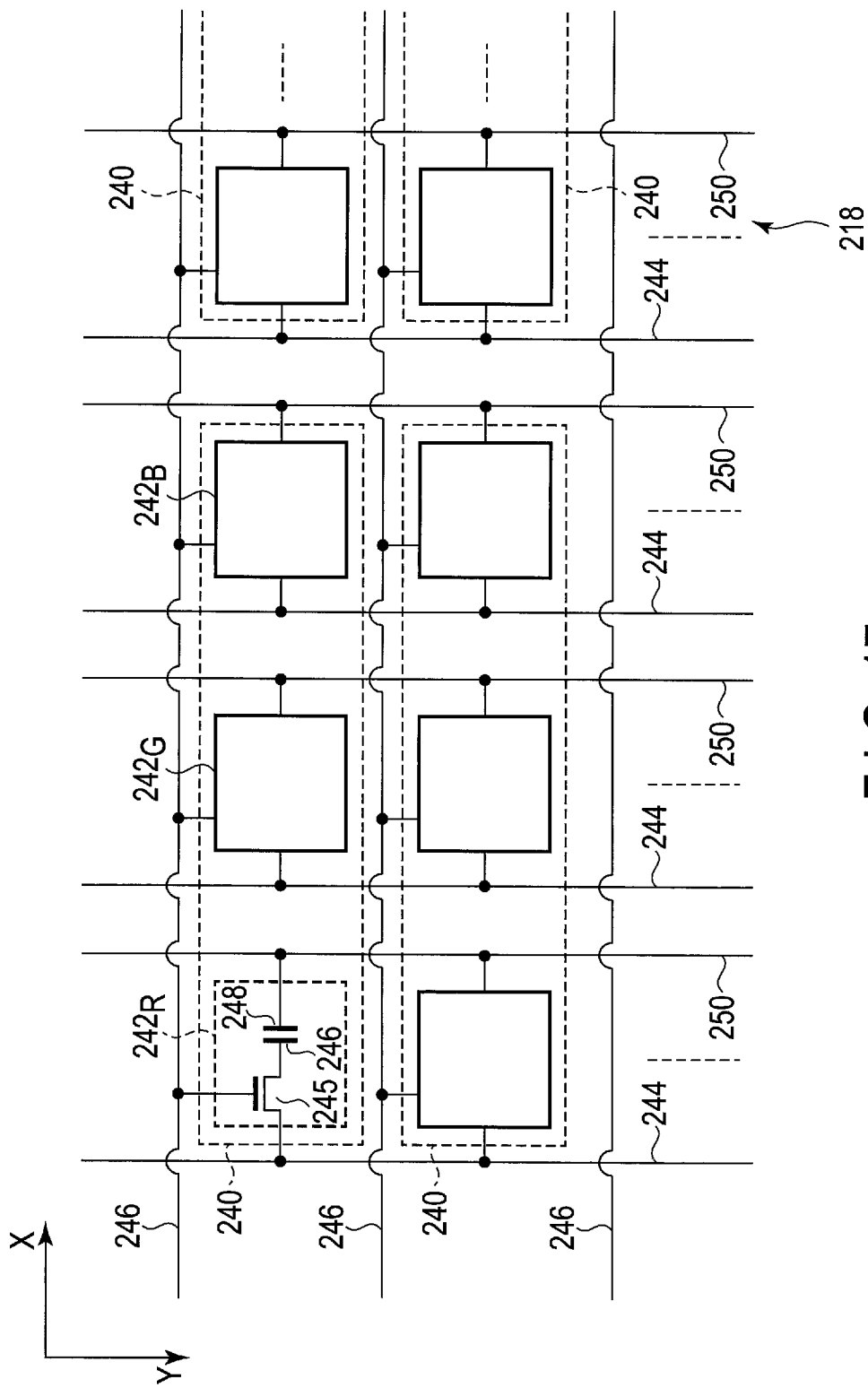
FIG. 17 is a perspective view illustrating an example of a pixel array of the display device according to the fifth embodiment.

FIG. 17 is a circuit diagram showing the pixel array 218. The pixel array 218 formed of a number of (for example, 1080×1920) pixels 240 in a matrix shape is formed at a central portion of the first substrate 212. Each pixel 240 is formed of red, green and blue, i.e., three-color sub-pixels 242R, 242G, and 242B (often generally called sub-pixels 242). The color components of the sub-pixels may be three colors other than red, green, and blue or four or more colors including red, green, blue and the other color (for example, white). Each sub-pixel 242 includes a switching element 245 formed of a thin-film MOSFET, a pixel electrode 246, and a common electrode 248.

Sources of the switching elements 245 of the sub-pixels 242 in each column are electrically connected to a common source line (often called a signal line) 244. As shown in FIG. 18, the source line 244 is electrically connected to a source amplifier 318 via an RGB select switch 304. Gates of the switching elements 245 of the sub-pixels 242 in each row are electrically connected to a common gate line (often called a scanning line) 246. The gate line 246 is electrically connected to a gate driver 302 as shown in FIG. 18. A drain of the switching element 245 of each sub-pixel 242 is electrically connected to the pixel electrode 246.

The gate line 246 is formed to extend in the X direction while the source line 244 is formed to extend in the Y direction. In other words, the sub-pixel 242 is formed near an intersection of the gate line 246 and the source line 244.

[Circuit Configuration]

FIG. 18 is a block diagram showing an example of the electric configuration of the display device. The gate driver 302 is formed outside at least one of longer sides (for example, a left longer side) of the pixel array 218 on the first substrate 212. The RGB select switch (also called a multiplexer) 304 is formed outside at least one of shorter sides (for example, a lower shorter side) of the pixel array 218 on the first substrate 212.

The display control device 216 includes a host I/F 312 electrically connected to the host device 226, and a touch panel I/F 322 electrically connected to the touch detection device 234. The image signal output from the host device 226 is received by the host I/F 312 and supplied to the pixel array 218 via a video memory 314, a line latch circuit 316, the source amplifier 318, and the RGB select switch 314. The host I/F 312 executes interpolation, synthesizing processing and the like to make the image signal supplied from the host device 226 suitable for display of the display device. The video memory 314 is formed of, for example, SRAM, DRAM or the like capable of storing at least one-frame image signal.

The line latch circuit 316 latches at least one-line image signal output from the video memory 314. An output of the line latch circuit 316 is converted into an analog signal corresponding to the gradation, in the source amplifier 318. The image signal is a time division multiplexing signal for red, green, and blue sub-pixel signals, and divided into the sub-pixels of the respective colors by the RGB select switch 304 operating based on an RGB select signal, and the sub-pixel signals are supplied to the pixel array 218. As shown in FIG. 17, the switching elements 245 in the sub-pixels 242 of the respective rows in the pixel array 218 are turned on via the gate lines 246 by the gate driver 302. The sub-pixel signal is supplied to the pixel electrode 246 via the switching element 245 which is turned on. In the display period, each of the sub-pixels 242 displays the image in accordance with the pixel signal since a constant DC voltage for display is supplied to all common electrodes 222.

A control signal for the gate driver 302 and a selection control signal for the RGB select switch 304 are supplied from a panel control signal generation circuit 324. The panel control signal generation circuit 324 also supplies a control signal to (a detection electrode of) the touch panel 220. A detection signal of the touch panel 220 is supplied to the touch detection device 234. The common electrodes of the pixel array 218 are driven by a common electrode driver 326 and a control signal of the common electrode driver 326 is supplied from the panel control signal generation circuit 324. The display control device 216 includes, for example, a timing controller 328 which determines operation timing of each portion, based on a synchronization signal, a command and the like received from the host device 226. The display control device 216 further includes an LED drive circuit 334. The LED drive circuit 334 is formed of any one of the LED drive circuits of the first to fourth embodiments, and operates the backlight unit 236 at appropriate timing, under control of the timing controller 328.

According to the fifth embodiment, the acoustic noise generated from the substrate due to the low frequency voltage variation of at least one first capacitor electrically connected to the input side of the LED drive circuit of the display device and at least one second capacitor electrically connected to the output side can be reduced.

According to the first to fifth embodiments, as explained above, the acoustic noise generated from the substrates due to the low frequency voltage variation of the ceramic capacitor can be reduced by arranging two types of capacitors in which the phases of the voltage variations of the two types of capacitors are opposite to each other, closely and further alternately. In the embodiments, two types of capacitors in which the phases of the voltage variations of the two types of capacitors are opposite to each other are at least one first capacitor electrically connected to the input side of the step-up circuit of the LED drive circuit and at least one second capacitor electrically connected to the output side, but can be applied to any devices. In the display device, too, the embodiments can be applied to, for example, not only the LED drive circuit, but an organic EL display. In addition, the embodiments can be applied to not only the acoustic noise of the brightness adjustment circuit of the light emitting element, but the acoustic noise from the substrates at changing the panel drive and the touch drive.

The idea of the embodiments can be applied to various circuits in which the ceramic capacitor is arranged on the substrate and driven by a low frequency voltage.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

What is claimed is:

1. A display device, comprising: a two-dimensional pixel array;
   a backlight under the pixel array; and
   a drive circuit configured to drive the backlight,
   wherein the drive circuit comprises a step-up circuit configured to step up an input voltage,
   the step-up circuit comprises at least one first ceramic capacitor electrically connected to an input side and at least one second ceramic capacitor electrically connected to an output side,
   the at least one first ceramic capacitor is near the at least one second ceramic capacitor to cause vibrations of the at least one first ceramic capacitor and the at least one second ceramic capacitor to cancel each other.

2. An electronic device comprising:
   a circuit board; and
   a circuit component on an upper surface or a lower surface of the circuit board, wherein
   the circuit component comprises a first ceramic capacitor and a second ceramic capacitor,
   vibration characteristics of the first ceramic capacitor and a second ceramic capacitor are opposed to each other,
   the first ceramic capacitor is near the second ceramic capacitor to cause vibrations of the first and second ceramic capacitors to cancel each other,
   the first ceramic capacitor comprises first capacitors, the second ceramic capacitor comprises second capacitors, and
   the first capacitors and the second capacitors are arranged alternately.

3. The electronic device of claim 2, wherein
   each of the first capacitors and each of the second capacitors are arranged alternately.

4. The electronic device of claim 2, wherein
   each of the first capacitors and each of the second capacitors are arranged alternately in column and row directions.

5. An electronic device comprising:
   a circuit board; and
   a circuit component on an upper surface or a lower surface of the circuit board,
   wherein
   the circuit component comprises a first ceramic capacitor and a second ceramic capacitor,
   vibration characteristics of the first ceramic capacitor and a second ceramic capacitor are opposed to each other,
   the first ceramic capacitor is near the second ceramic capacitor to cause vibrations of the first and second ceramic capacitors to cancel each other,
   the first ceramic capacitor comprises first capacitors,
   the second ceramic capacitor comprises second capacitors,
   an amplitude of the vibration of the first ceramic capacitor is different from an amplitude of the vibration of the second ceramic capacitor, and
   number corresponding to the amplitude of the vibration of the second ceramic capacitor, of the first capacitors and number corresponding to the amplitude of the vibration of the first ceramic capacitor, of the second capacitors, are arranged alternately.

6. The electronic device of claim 5, wherein
   the first capacitors and the second capacitors are arranged alternately in the column and row directions.

7. An electronic device comprising,
   a circuit board; and
   a circuit component on an upper surface or a lower surface of the circuit board,
   wherein
   the circuit component comprises a first ceramic capacitor and a second ceramic capacitor,
   vibration characteristics of the first ceramic capacitor and a second ceramic capacitor are opposed to each other,
   the first ceramic capacitor is near the second ceramic capacitor to cause vibrations of the first and second ceramic capacitors to cancel each other,
   the circuit component further comprises a first component of a step-up circuit configured to step up an input voltage to a predetermined voltage,
   the first ceramic capacitor comprises a capacitor electrically connected to an input side of the step-up circuit, and
   the second ceramic capacitor comprises a capacitor electrically connected to an output side of the step-up circuit.

8. The electronic device of claim 7, wherein
   the circuit component further comprises a second component of a driving circuit configured to drive a light-emitting diode with the predetermined voltage and a third component of a switch control circuit configured to operate or stop the step-up circuit based on a dimming signal.

9. The electronic device of claim 8, wherein
   the dimming signal comprises a binary rectangular wave having a frequency of 1 kHz or less.

10. The electronic device of claim 7, wherein
    the step-up circuit comprises a switching regulator or a three-terminal regulator.

11. An electronic device comprising:
    a circuit board; and
    a circuit component on an upper surface or a lower surface of the circuit board,
    wherein
    the circuit component comprises a first ceramic capacitor and a second ceramic capacitor,
    vibration characteristics of the first ceramic capacitor and a second ceramic capacitor are opposed to each other, the first ceramic capacitor is near the second ceramic capacitor to cause vibrations of the first and second ceramic capacitors to cancel each other, and a power source voltage applied to the first ceramic capacitor is applied to the second ceramic capacitor via an inverting circuit.

12. The electronic device of claim 11, wherein the inverting circuit comprises an operational amplifier, a voltage is applied to an inverted input terminal of the operational amplifier via an input resistor, and half of the power source voltage is applied to a non-inverted input terminal of the operational amplifier.

13. An electronic device, comprising:

a circuit board; and a circuit component on an upper surface or a lower surface of the circuit board, wherein the circuit component comprises a first ceramic capacitor and a second ceramic capacitor, each of the first ceramic capacitor and the second ceramic capacitor comprises a pair of external electrodes, the first ceramic capacitor and the second ceramic capacitor are arranged adjacent to each other wherein the pair of external electrodes are arranged in a same direction, a first alternating voltage is applied to the pair of external electrodes of the first ceramic capacitor, a second alternating voltage is applied to the pair of external electrodes of the second ceramic capacitor, and a phase of the first alternating voltage is opposite to a phase of the second alternating voltage.

14. The electronic device of claim 13, wherein each of the first ceramic capacitor and the second ceramic capacitor comprises internal electrodes layered alternately with ceramic dielectric; and the pair of the external electrodes is connected to the internal electrodes and on both sides of the first ceramic capacitor and the second ceramic capacitor.

* * * * *